United States Patent
Khandros et al.

(10) Patent No.: US 6,442,831 B1
(45) Date of Patent: Sep. 3, 2002

(54) METHOD FOR SHAPING SPRING ELEMENTS

(75) Inventors: Igor Y. Khandros, Livermore, CA (US); Thomas H. Dozier, Carrolton, TX (US); Gary W. Grube, Pleasanton; Gaetan L. Mathieu, Dublin, both of CA (US)

(73) Assignee: FormFactor, Inc., Livermore, CA (US)

(*) Notice: Subject to any disclaimer, the term of this patent is extended or adjusted under 35 U.S.C. 154(b) by 0 days.

(21) Appl. No.: 08/794,202

(22) Filed: Jan. 24, 1997

Related U.S. Application Data

(63) Continuation of application No. PCT/US96/08276, filed on May 28, 1996, application No. 08/794,202, which is a continuation-in-part of application No. 08/452,255, filed on May 26, 1995, which is a continuation-in-part of application No. 08/340,144, filed on Nov. 15, 1994, now Pat. No. 5,917,707, which is a continuation-in-part of application No. 08/152,812, filed on Nov. 16, 1993, now Pat. No. 5,476,211, application No. 08/794,202, which is a continuation-in-part of application No. 08/570,230, filed on Dec. 11, 1995, now Pat. No. 5,852,871, and a continuation-in-part of application No. 08/457,479, filed on Jun. 1, 1995, now Pat. No. 6,049,976, each is a division of application No. 08/152,812, filed on Nov. 16, 1993, now Pat. No. 5,476,211, application No. 08/794,202, which is a continuation-in-part of application No. 08/602,179, filed on Feb. 15, 1996, now abandoned, and a continuation-in-part of application No. 08/584,981, filed on Jan. 11, 1996, now Pat. No. 5,820,014, and a continuation-in-part of application No. 08/573,945, filed on Dec. 18, 1995, now Pat. No. 5,601,740, and a continuation-in-part of application No. 08/558,332, filed on Nov. 15, 1995, now Pat. No. 5,829,128, and a continuation-in-part of application No. 08/554,902, filed on Nov. 9, 1995, now Pat. No. 5,974,662, and a continuation-in-part of application No. 08/533,584, filed on Oct. 18, 1995, now Pat. No. 5,772,451, and a continuation-in-part of application No. 08/526,246, filed on Sep. 21, 1995.

(60) Provisional application No. 60/005,189, filed on May 17, 1996, provisional application No. 60/013,247, filed on Mar. 11, 1996, provisional application No. 60/012,878, filed on Mar. 5, 1996, provisional application No. 60/012,040, filed on Feb. 22, 1996, and provisional application No. 60/012,027, filed on Feb. 21, 1996.

(51) Int. Cl.$^7$ ................................................ H01R 9/00
(52) U.S. Cl. ..................... 29/843; 29/841; 228/188; 228/199; 228/246
(58) Field of Search .................... 29/832, 840, 841, 29/843, 829; 228/199, 188, 246

(56) References Cited

U.S. PATENT DOCUMENTS 5,195,237 A * 3/1993 Cray et al.
5,513,430 A * 5/1996 Yanof et al.

OTHER PUBLICATIONS

Research disclosure Sep., 1989, No. 30508.*
IBM Tech Disc. Bull. vol. 34, No. 5, Oct. 1991, p. 180.*

* cited by examiner

Primary Examiner—Carl J. Arbes
(74) Attorney, Agent, or Firm—O'Melveny & Myers LLP

(57) ABSTRACT

Interconnection elements for electronic components, exhibiting desirable mechanical characteristics (such as resiliency, for making pressure contacts) are formed by using a shaping tool (512) to shape an elongate core element (502) of a soft material (such as gold or soft copper wire) to have a springable shape (including cantilever beam, S-shape, U-shape), and overcoating the shaped core element with a hard material (such as nickel and its alloys), to impart a desired spring (resilient) characteristic to the resulting composite interconnection element. A final overcoat of a material having superior electrical qualities (e.g., electrical conductivity and/or solderability) may be applied to the composite interconnection element. The resulting interconnection elements may be mounted to a variety of electronic components, including directly to semiconductor dies and wafers (in which case the overcoat material anchors the composite interconnection element to a terminal (or the like) on the electronic component), may be mounted to support substrates for use as interposers and may be mounted to substrates for use as probe cards or probe card inserts. The shaping tool may be an anvil (622) and a die (624), and may nick or sever successive shaped portions of the elongate element, and the elongate element may be of an inherently hard (springy) material. Methods of fabricating interconnection elements on sacrificial substrates are described. Methods of fabricating tip structures (258) and contact tips at the end of interconnection elements are also described.

13 Claims, 8 Drawing Sheets

METHOD FOR SHAPING SPRING ELEMENTS

CROSS-REFERENCE TO RELATED APPLICATIONS

This patent application is a continuation of PCT International Application Serial No. US96/08276 which was filed on May 28, 1996 and designated the United States. This patent application is based on Provisional U.S. Application Serial No. 60/013,247 which was filed on Mar. 11, 1996. This patent application is a continuation-in-part of commonly-owned, U.S. patent application Ser. No. 08/452,255 (hereinafter "PARENT CASE") filed May 26, 1995 and its counterpart PCT patent application Ser. No. PCT/US95/14909 filed Nov. 13, 1995, both of which are continuations-in-part of commonly-owned, U.S. patent application Ser. No. 08/340,144 filed Nov. 15, 1994 and U.S. Pat. No. 5,917,707, issued Jun. 29, 1999 now its counterpart PCT patent application number PCT/US94/13373 filed Nov. 16, 1994 (published May 26, 1995 as WO 95/14314, both of which are continuations-in-part of commonly-owned, U.S. patent application Ser. No. 08/152,812 filed Nov. 16, 1993 (now U.S. Pat. No. 5,476,211, Dec. 19, 1995), all of which are incorporated by reference herein.

This patent application is also a continuation-in-part of U.S. application Ser. No. 08/570,230 which was filed on Dec. 11, 1995, now U.S. Pat. No. 5,852,871, issued Dec. 29, 1999 and U.S. application Ser. No. 08/457,479 which was filed on Jun. 1, 1995, now U.S. Pat. No. 6,044,976, issued Apr. 18, 2000 both of which are divisionals of U.S. application Ser. No. 08/152,812 which was filed on Nov. 16, 1993 (now U.S. Pat. No. 5,476,211 issued on Dec. 19, 1995).

This patent application is also a continuation-in-part of the following commonly-owned, U.S. patent application Ser. Nos.:

08/526,246 filed Sep. 21, 1995 (PCT/US95/14842, Nov. 13, 1995);

08/533,584 filed Oct. 18, 1995 now U.S. Pat. No. 5,772,451, issued Jun. 30, 1998 (PCT/US95/14843, Nov. 13, 1995);

08/554,902 filed Nov. 9, 1995 now U.S. Pat. No. 5,974,662, issued Nov. 2, 1999, (PCT/US95/14844, Nov. 13, 1995);

08/558,332 filed Nov. 15, 1995 now U.S. Pat. No. 5,829,128, issued Nov. 3, 1998, (PCT/US95/14885, Nov. 15, 1995);

08/573,945 filed Dec. 18, 1995; now U.S. Pat. No. 5,601,740 issued Feb. 11, 1997

08/584,981 filed Jan. 11, 1996; now U.S. Pat. No. 5,820,014, issued Oct. 13, 1998, 08/602,179 filed Feb. 15, 1996; now abandoned, 60/012,027 filed Feb. 21, 1996;

60/012,040 filed Feb. 22, 1996;

60/012,878 filed Mar. 5, 1996; and 60,005,189 filed May 17, 1996 all of which, except for the Provisional cases, are continuations-in-part of the aforementioned PARENT CASE, and all of which are incorporated by reference herein.

TECHNICAL FIELD OF THE INVENTION

The invention relates to shaping bond wires, particularly free-standing bond wires used as core elements for composite interconnection element such as are described in commonly-owned, copending U.S. patent application Ser. No. 08/452,255 filed May 26, 1995 (status: pending) and its counterpart PCT patent application number PCT/US95/14909 filed Nov. 13, 1995.

BACKGROUND OF THE INVENTION

Electronic components, particularly microelectronic components such as semiconductor devices (chips), often have a plurality of terminals (also referred to as bond pads, electrodes, or conductive areas). In order to assemble such devices into a useful system (or subsystem), a number of individual devices must be electrically interconnected with one another, typically through the intermediary of a printed circuit (or wiring) board (PCB, PWB).

Generally, interconnections between electronic components can be classified into the two broad categories of "relatively permanent" and "readily demountable".

An example of a "relatively permanent" connection is a solder joint. Once two electronic components are soldered to one another, a process of unsoldering must be used to separate the components. A wire bond is another example of a "relatively permanent" connection.

An example of a "readily demountable" connection is rigid pins of one electronic component being received by resilient socket elements of another electronic component. The socket elements exert a contact force (pressure) on the pins in an amount sufficient to ensure a reliable electrical connection therebetween. Interconnection elements intended to make pressure contact with an electronic component are referred to herein as "springs" or "spring elements" of "spring contacts".

Prior art techniques for making spring contact elements generally involve stamping (punching) or etching a "monolithic" spring material, such as phosphor bronze or beryllium copper or steel or a nickel-iron-cobalt (e.g., kovar) alloy, to form individual spring elements, shaping the spring elements to have a spring shape (e.g., arcuate, etc.), plating the spring elements with a good contact material (e.g., a noble metal such as gold, which will exhibit low contact resistance when contacting a like material), and molding a plurality of such shaped, plated spring elements into a linear, a peripheral or an array pattern. When plating gold onto the aforementioned materials, sometimes a thin (for example, 30–50 microinches, barrier layer of nickel is appropriate.

Generally, a certain minimum contact force is desired to effect reliable pressure contact to electronic components (e.g., to terminals on electronic components). For example, a contact (load) force of approximately 15 grams (including as little as 2 grams or less and as much as 150 grams or more, per contact) may be desired to ensure that a reliable electrical connection is made to a terminal of an electronic component which may be contaminated with films on its surface, or which has corrosion or oxidation products on its surface. The minimum contact force required of each spring element typically demands either that the yield strength of the spring material or that the size of the spring element are increased. However, generally, the higher the yield strength of a material, the more difficult it will be to work with (e.g., punch, bend, etc.). And the desire to make springs smaller essentially rules out making them larger in cross-section.

In commonly-owned, copending U.S. patent application Ser. No. 08/452,255 filed May 26, 1995 (and its counterpart PCT/US95/14909 filed Nov. 13, 1995), techniques are described for shaping elongate core elements (wire stems) of composite interconnection elements using a wirebonder. A one end of a supply wire is ball-bonded to an area (e.g., terminal) on a substrate (e.g., electronic component) by urging a capillary of a wirebonder downward (z-axis) onto the substrate. The capillary is then withdrawn (upward), and as the wire plays (feeds) out of the capillary, the substrate is moved in the x–y plane to impart a desired spring shape to the portion of the wire between the substrate and the capillary. The wire is then severed adjacent the capillary, resulting in a free-standing wire stem which is mounted to the substrate. The possibility of using external, mechanical instrumentalities to impart the desired shape to the wire stem is discussed, and is elaborated upon herein.

The following U.S. Patents are cited as being of interest: 5,386,344; 5,336,380; 5,317,479; 5,086,337; 5,067,007; 4,989,069; 4,893,172; 4,793,814; 4,777,564; 4,764,848; 4,667,219; 4,642,889; 4,330,165; 4,295,700; 4,067,104; 3,795,037; 3,616,532; and 3,509,270.

Attention if also directed to U.S. Pat. No. 5,045,975 issued Sep. 03, 1991, entitled THREE-DIMENSIONALLY INTERCONNECTED MODULE ASSEMBLY, which discloses ball bonding a plurality of gold wires (leads) onto and substantially perpendicular to an integrated circuit die, and inserting the gold leads into plated through holes of printed circuit boards to effect an electrical and mechanical connection therebetween. The technique is also useful for interconnecting sandwiched assemblies of circuit boards. This patent illustrates the feasibility of adding a notching mechanism to a wirebonder (ball bonder), and also illustrates the technique.

BRIEF DESCRIPTION (SUMMARY) OF THE INVENTION

It is an object of the invention to provide an improved technique for shaping core elements of a composite interconnection element to have an appropriate spring shape.

It is another an object of the invention to provide a technique for fabricating resilient interconnection elements (contact structures) for electronic components, particularly for microelectronic components.

It is another object of the invention to provide resilient contact structures (interconnection elements) that are suitable for making pressure contact to electronic components.

It is another object of the invention to provide a technique for securely anchoring interconnection elements to electronic components.

According to the invention, an external mechanical instrumentality (shaping tool) is used to impart a desired shape to portion of an elongate element (e.g., a bond wire).

In an embodiment of the invention, the shaping tool is a one-part tool, which urges (pushes) against a portion of the bond wire extending between an area (e.g., terminal) on a substrate (e.g., electronic component, sacrificial substrate, etc.) and a capillary of a wirebonder.

In another embodiment of the invention, the shaping tool is a two-part tool, comprising an anvil and a die. The anvil and die are brought together, with the elongate element (e.g., wire) therebetween, to impart the desired shape to the elongate element.

According to an aspect of the invention, the shaping tool is provided with a feature which can nick or completely sever the elongate element while performing shaping.

According to an aspect of the invention, the shaping tool can be biased (at an electrical potential, including ground) to control a spark (electrical discharge) which is used to sever the elongate element.

According to another aspect of the invention, regions of reduced diameter formed by the shaping tool can "attract" a spark during spark-severing (e.g., from an EFO electrode).

The present invention is particularly useful for, but is not limited to, shaping core elements of composite interconnection elements, which are fabricated by bonding a one end of a bond wire to a terminal on an electronic component (or to an area of a sacrificial substrate), imparting a spring shape to the wire, and severing the wire to be a free-standing wire stem (core element). The free-standing wire stem is overcoated with one or more layers of material to impart a desired resiliency and, optionally, electrical contact characteristics to the resulting composite interconnection element. It is within the scope of this invention that the core element is other than a wire having a circular cross-section. For example, the core element may have a rectangular cross-section and be in the form of a "ribbon".

The disclosed techniques overcome problems associated with making spring elements of extremely small size, yet which are capable of exerting contact forces of sufficient magnitude to ensure reliable interconnections. The disclosed techniques also overcome problems associated with mounting spring contacts directly on various electronic components, such as semiconductor devices.

The use of the term "composite", throughout the description set forth herein, is consistent with a 'generic' meaning of the term (e.g., formed of two or more elements), and is not to be confused with any usage of the term "composite" in other fields of endeavor, for example, as it may be applied to materials such as glass, carbon or other fibers supported in a matrix of resin or the like.

As used herein, the term "spring shape" refers to virtually any shape of an elongate element which will exhibit elastic (restorative) movement of an end (tip) of the elongate element with respect to a force applied to the tip. This includes elongate elements shaped to have one or more bends, as well as substantially straight elongate elements.

As used herein, the terms "contact area", "terminal", "pad", and the like refer to any conductive area on any electronic component (including passive substrates and sacrificial substrates) to which an interconnection element is mounted or makes contact.

Generally, the core is a "soft" material having a relatively low yield strength, and is overcoated with a "hard" material having a relatively high yield strength. For example, a soft material such as a gold wire is attached (e.g., by wire bonding) to a terminal of an electronic component, and is overcoated (e.g., by electrochemical plating) with a hard material such nickel and its alloys.

Generally, throughout the description set forth herein, the term "plating" is used as exemplary of a number of techniques for overcoating the core element. It is within the scope of this invention that the core element can be overcoated by any suitable technique including, but not limited to: various processes involving deposition of materials out of aqueous solutions; electrolytic plating; electroless plating; chemical vapor deposition (CVD); physical vapor deposition (PVD); processes causing the deposition of materials through induced disintegration of liquid or solid precursors; and the like, all of these techniques for depositing materials being generally well known.

Generally, for overcoating the core element with a metallic material such as nickel, electrochemical processes are preferred, especially electrolytic plating.

Representative materials, both for the core element and for the overcoating, are disclosed.

In the main hereinafter, techniques involving beginning with a relatively soft (low yield strength) core element, which is generally of very small dimension (e.g., 3.0 mil or less) are described. Soft materials, such as gold, which attach easily to the metallization (e.g., aluminum) of semiconductor devices, generally lack sufficient resiliency to function as springs. (Such soft, metallic materials exhibit primarily plastic, rather than elastic deformation.) Other soft materials which may attach easily to semiconductor devices and possess appropriate resiliency are often electrically non-conductive, as in the case of most elastomeric materials. In either case, desired structural and electrical characteristics can be imparted to the resulting composite interconnection element by the overcoating applied over the core. The resulting composite interconnection element can be made very small, yet can exhibit appropriate contact forces. Moreover, a plurality of such composite interconnection elements can be arranged at a fine pitch (e.g., 10 mils), even though the have a length (e.g., 100 mils) which is much greater than the distance to a neighboring composite interconnection element (the distance between neighboring interconnection elements being termed "pitch").

It is within the scope of this invention that composite interconnection elements can be fabricated on a microminiature scale, for example as "microsprings" for connectors and sockets, having cross-sectional dimensions on the order of twenty-five microns ($\mu$m), or less. This ability to manufacture reliable interconnection having dimensions measured in microns, rather than mils, squarely addresses the evolving needs of existing interconnection technology and future area array technology.

The composite interconnection elements of the invention exhibit superior electrical characteristics, including electrical conductivity, solderability and low contact resistance. In many cases, deflection of the interconnection element in response to applied contact forces results in a "wiping" contact, which helps ensure that z reliable contact is made.

An additional advantage of the invention is that connections made with the interconnection elements of the invention are readily demountable. Soldering, to effect the interconnection to a terminal of an electronic component is optional, but is generally not preferred at a system level.

According to an aspect of the invention, interconnection elements can be pre-fabricated as individual units, for later attachment to electronic components. Various techniques for accomplishing this objective are set forth herein. Although not specifically covered in this document, it is deemed to be relatively straightforward to fabricate a machine that will handle the mounting of a plurality of individual interconnection elements to a substrate or, alternatively, suspending a plurality of individual interconnection elements in an elastomer, or on a support substrate.

It should clearly be understood that the composite interconnection element of the invention differs dramatically from interconnection elements of the prior art which have been coated to enhance their electrical conductivity characteristics or to enhance their resistance to corrosion.

In addition to controlling the resiliency of the resulting composite interconnection element, the overcoating substantially enhances anchoring of the interconnection element to a terminal of an electronic component. Stresses (contact forces) are directed to portions of the interconnections elements which are specifically intended to absorb the stresses.

One advantage of the invention is that the processes described herein are well-suited to "pre-fabricating" interconnection elements, particularly resilient interconnection elements, such as on a sacrificial member, then later mounting the interconnection elements to an electronic component. In contrast to fabricating the interconnection elements directly on the electronic component, this allows for reduced cycle time in processing the electronic components. Additionally, yield issues which may be associated with the fabrication of the interconnection elements are thus disassociated from the electronic component. For example, it would be disingenuous for an otherwise perfectly good, relatively expensive integrated circuit device to be ruined by glitches in the process of fabricating interconnection elements mounted thereto. The mounting of pre-fabricated interconnection elements to electronic components is relatively straightforward, as is evident from the description set forth hereinbelow.

It should also be appreciated that the invention provides essentially a new technique for making spring structures. Generally, the operative structure of the resulting spring is a product of plating, rather than of bending and shaping. This opens the door to using a wide variety of materials to establish the spring shape, and a variety of "friendly" processes for attaching the "falsework" of the core to electronic components. The overcoating functions as a "superstructure" over the "falsework" of the core, both of which terms have their origins in the field of civil engineering.

One of the significant advantages of using a readily-deformable, malleable, compliant material for the wire stem is that it is readily configured to establish a shape for the overcoat applied thereto, without significantly altering the physical properties (e.g., tensile strength, resiliency, etc.) of the resulting resilient contact structure. Inasmuch as the wire stem serves as an important first step in the overall process (begun, but not completed) of fabricating a resulting contact structure, the wire stem can be characterized as an "inchoate" contact structure.

The composite interconnection (spring) elements of the invention are applicable to a broad range of applications, for example, for use in interposers. The subject of using composite interconnection elements in interposers has been discussed in the PARENT CASE. Generally, as used herein, an "interposer" is a substrate having contacts on two opposite surfaces thereof, disposed between two electronic components to interconnect the two electronic components. Often, it is desirable that the interposer permit at least one of the two interconnected electronic components to be removed (e.g., for replacement, upgrading, and the like).

The invention differs dramatically from the prior art in that an overcoat is used to impart desired mechanical characteristics (e.g., elasticity) to an otherwise non-elastic, readily-formed, inchoate interconnection element (contact structure). In the prior art, coatings (including gold platings) are principally used to enhance electrical characteristics of interconnection elements, and to prevent corrosion thereof.

The composite interconnection elements can either be fabricated "in-situ" on electronic components, or "pre-fabricated" for later mounting to electronic components.

Among the advantages of using a shaping tool to impart a desired shape to a portion of an elongate element (e.g., wire), versus imparting the shape by moving the component relative to the capillary (or vice-versa), are:

problems with springback are largely avoided;

the desired shape can be developed more quickly;

a plurality of shaped portions of elongate elements can be produced in a more reproducible manner;

more positive control over the shape of the shaped portions of the elongate elements can be achieved; and a plurality of free-standing, shaped wires can be mounted closer to one another on a substrate.

In instances wherein it is desired to shape and mount free-standing elongate elements to substrates, each free-standing elongate element having its own orientation, the shaping tool can be provided with sufficient degrees of freedom to accommodate the various orientations.

For shaping relatively hard materials, such as may be used for monolithic interconnection elements or hard cores of composite interconnection elements, a shaping tool may be particularly useful, and may be preferred.

Other objects, features and advantages of the invention will become apparent in light of the following description thereof.

BRIEF DESCRIPTION OF THE DRAWINGS

Reference will now be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

In the side views presented herein, often portions of the side view are presented in cross-section, for illustrative clarity. For example, in many of the views, the wire stem is shown full, as a bold line, while the overcoat is shown in true cross-section (often without crosshatching).

In the figures presented herein, the size of certain elements are often exaggerated (not to scale, vis-a-vis other elements in the figure), for illustrative clarity.

Figure 1A:
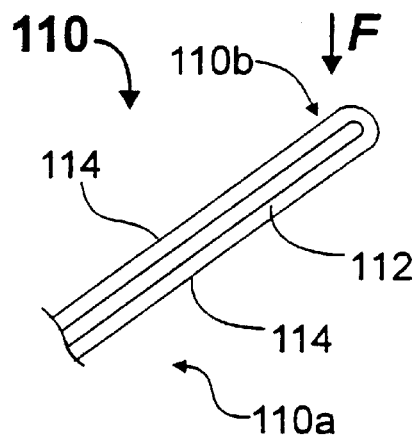

FIG. 1A is a cross-sectional view of a longitudinal portion, including one end, of an interconnection element, according to an embodiment of the invention.

Figure 1B:
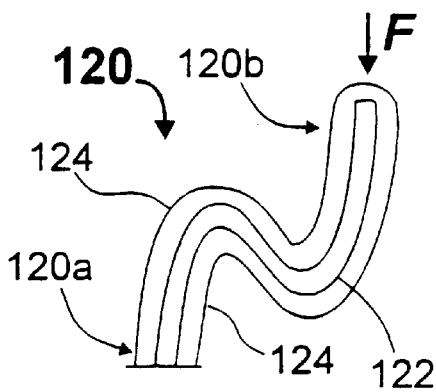

FIG. 1B is a cross-sectional view of a longitudinal portion, including one end, of an interconnection element, according to another embodiment of the invention.

Figure 1C:
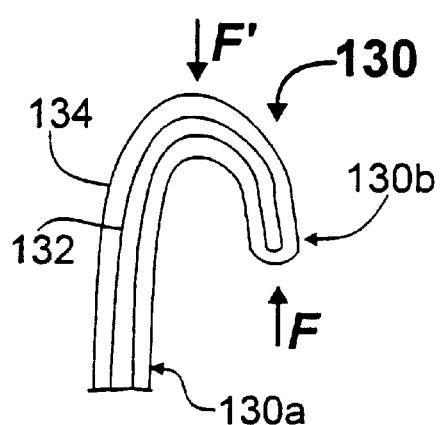

FIG. 1C is a cross-sectional view of a longitudinal portion, including one end of an interconnection element, according to another embodiment of the invention.

Figure 1D:
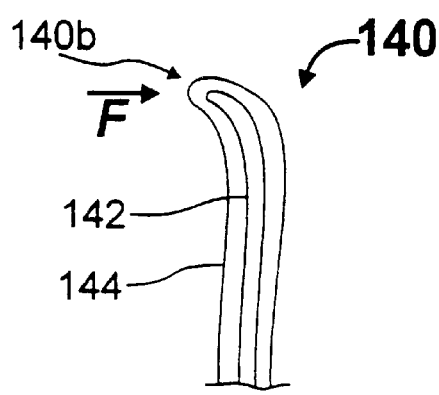

FIG. 1D is a cross-sectional view of a longitudinal portion, including one end, of an interconnection element, according to another embodiment of the invention.

Figure 1E:
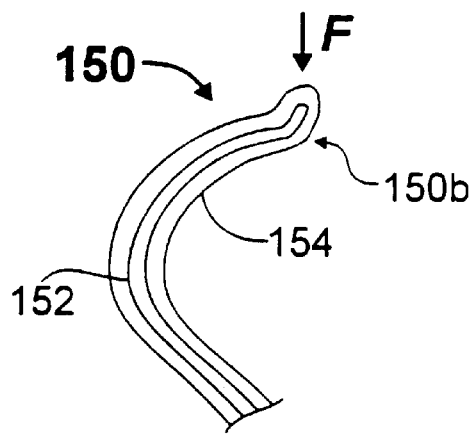

FIG. 1E is a cross-sectional view of a longitudinal portion, including one end, of an interconnection element, according to another embodiment of the invention.

Figure 2A:
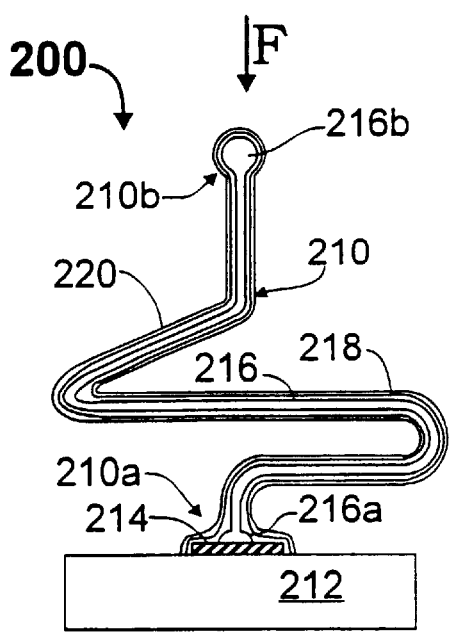

FIG. 2A is a cross-sectional view of an interconnection element mounted to a terminal of an electronic component and having a multi-layered shell, according to the invention.

Figure 2B:
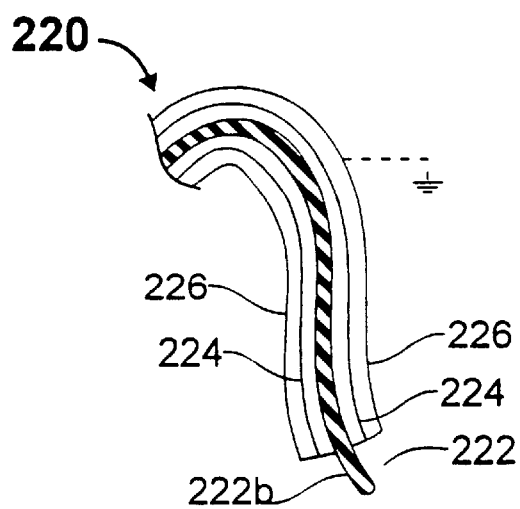

FIG. 2B is a cross-sectional view of an interconnection element having a multi-layered shell, wherein an intermediate layer is of a dielectric material, according to the invention.

Figure 2C:
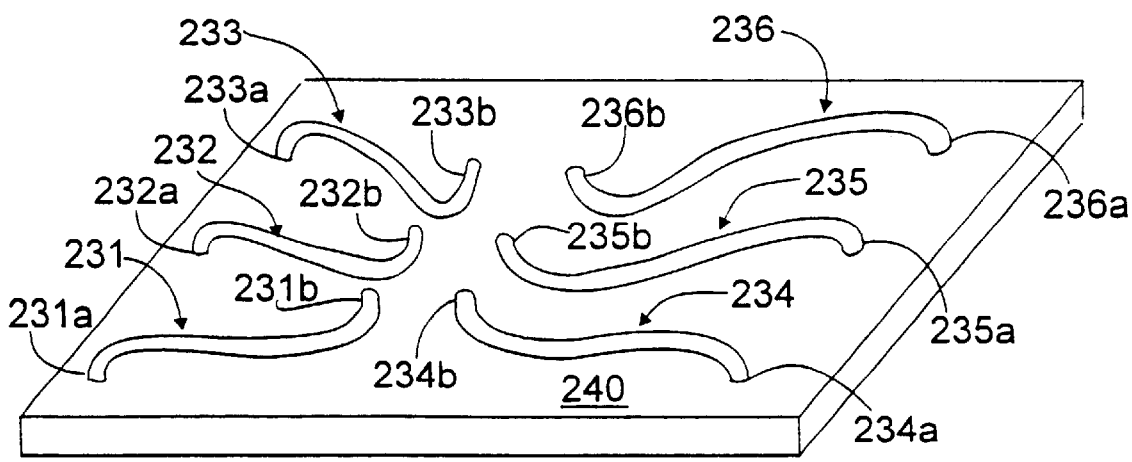

FIG. 2C is a perspective view of a plurality of interconnection elements mounted to an electronic component (e.g., a probe card insert), according to the invention.

Figure 2D:
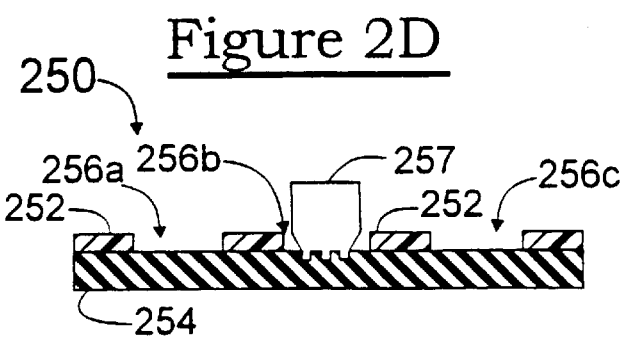

FIG. 2D is a cross-sectional view of an exemplary first step of a technique for manufacturing interconnection elements, according to the invention.

Figure 2E:
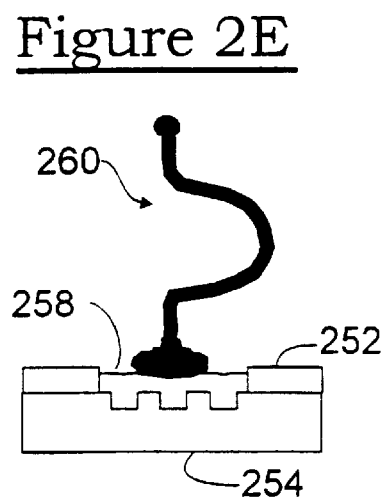

FIG. 2E is a cross-sectional view of an exemplary further step of the technique of FIG. 2D for manufacturing interconnection elements, according to the invention.

Figure 2F:
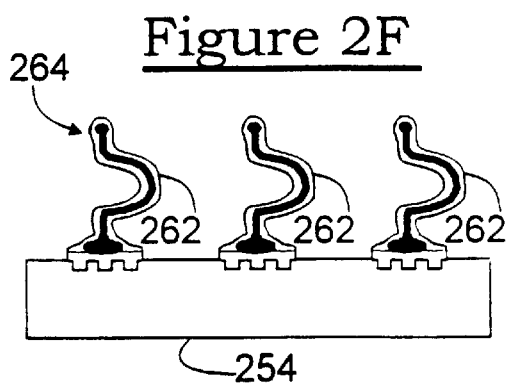

FIG. 2F is a cross-sectional view of an exemplary further step of the technique of FIG. 2E for manufacturing interconnection elements, according to the invention.

Figure 2G:
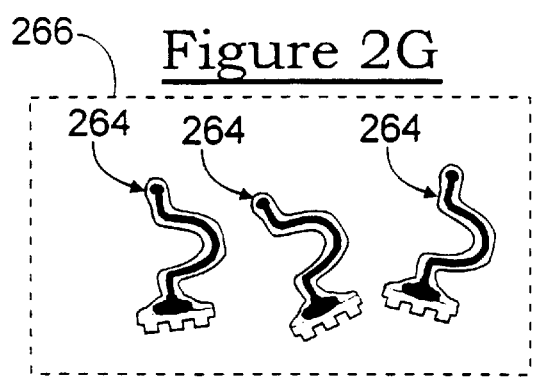

FIG. 2G is a cross-sectional view of an exemplary plurality of individual interconnection elements fabricated according to the technique of FIGS. 2D–2F, according to the invention.

Figure 2H:
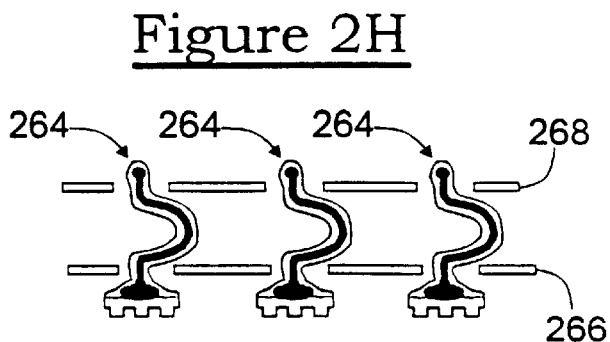

FIG. 2H is a cross-sectional view of an exemplary plurality of interconnection elements fabricated according to the technique of FIGS. 2D–2F, and associated in a prescribed spatial relationship with one another, according to the invention.

Figure 2I:
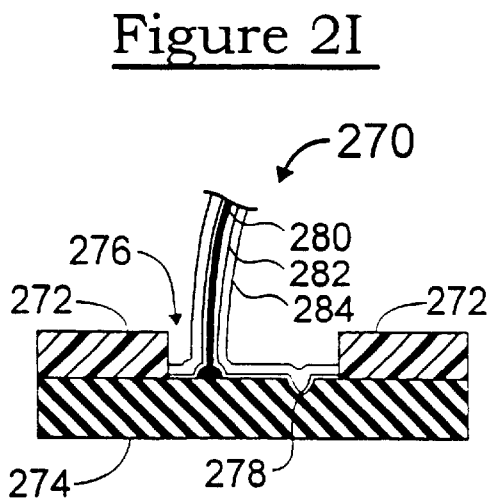

FIG. 2I is a cross-sectional view of an alternate embodiment for manufacturing interconnection elements, showing a one end of one element, according to the invention.

Figure 3:
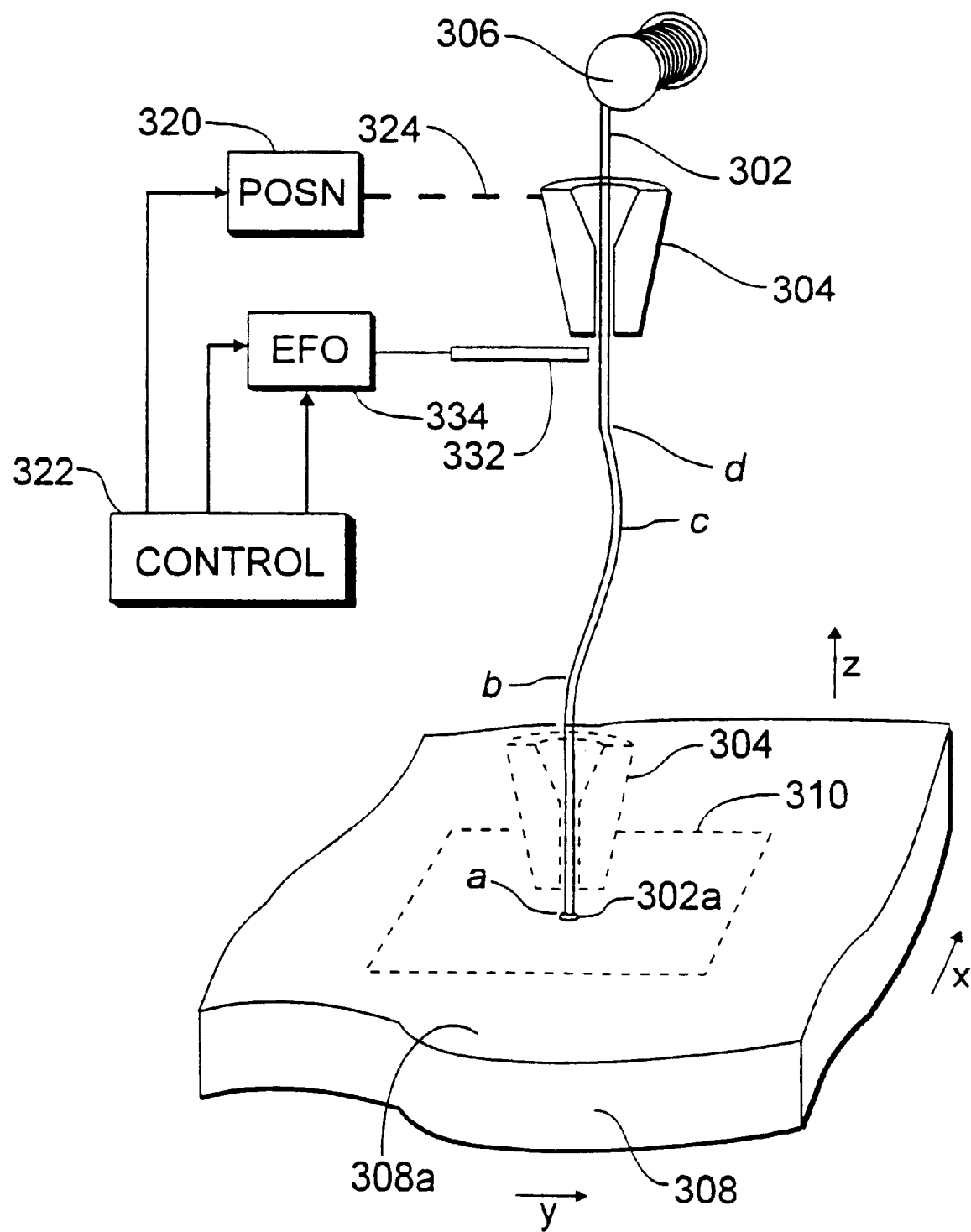

FIG. 3 is a partially-perspective, partially-schematic view of wirebonding apparatus mounting a wire stem to a substrate (e.g., electronic component), according to the invention. In this embodiment, the wire stem is shaped by relative movement between the capillary of the wirebonder and the substrate to which the wire stem is bonded.

Figure 4A:
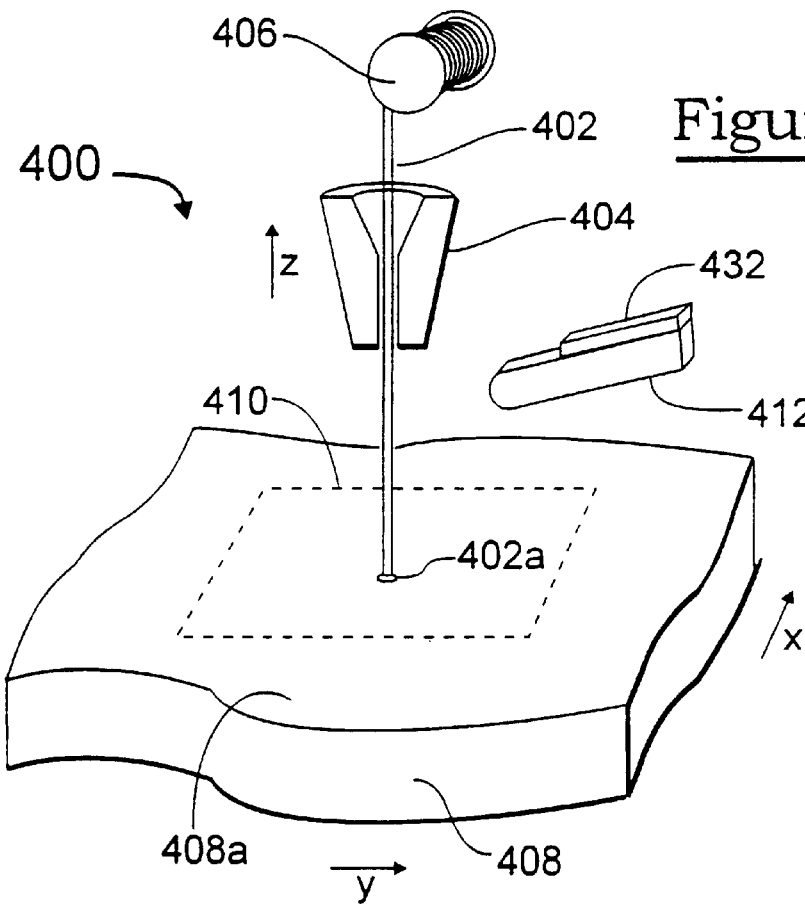

FIG. 4A is a perspective view of operative portions of a wirebonding apparatus mounting a wire stem to a substrate (e.g., electronic component), according to the present invention. In this embodiment, the wire stem will be shaped by an external shaping tool which is urged against the wire stem.

Figure 4B:
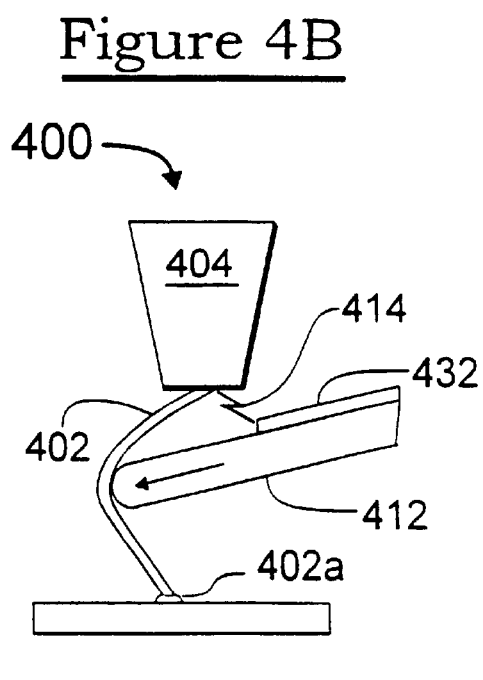

FIG. 4B is a side view of the wirebonding apparatus of FIG. 4A illustrating the technique of shaping the wire stem by means of the external shaping tool and, in conjunction with shaping the wire stem, severing the wire stem to be free-standing, according to the present invention.

Figure 4C:
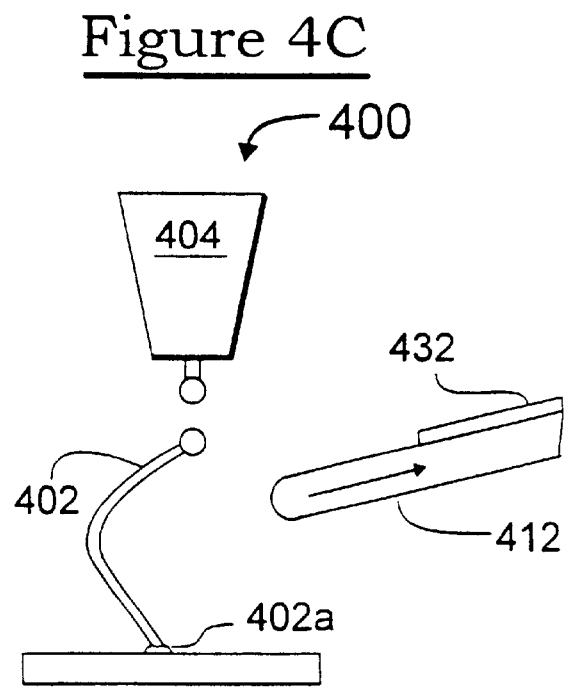

FIG. 4C is a side view of the wirebonding apparatus of FIG. 4B, illustrating a fully-formed wire stem, and a ball having been formed at the end of the supply wire for making subsequent wire bonds, according to the present invention.

Figure 5A:
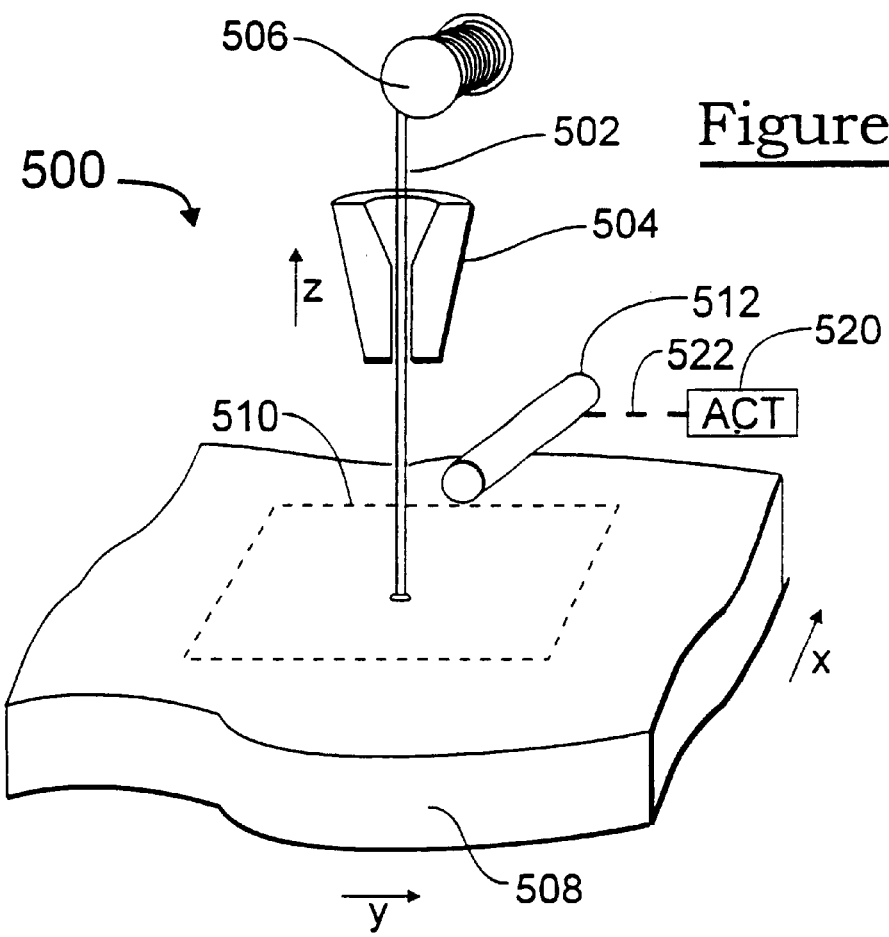

FIG. 5A is a perspective view of wirebonding apparatus, including an embodiment of an external shaping tool, according to the invention.

Figure 5B:
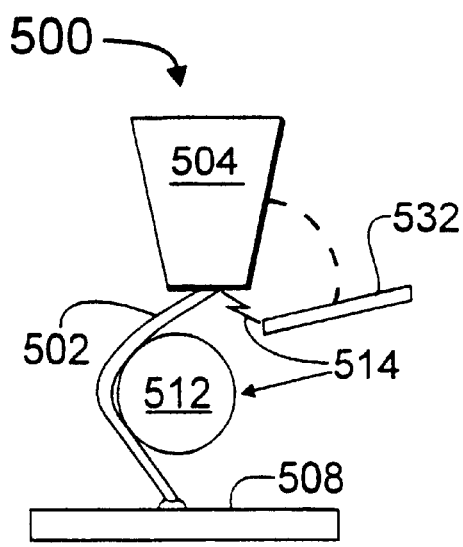
Figure 5C:
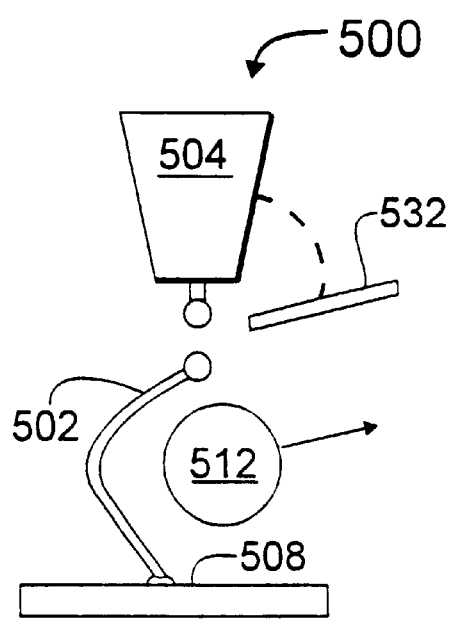

FIGS. 5B and 5C are side views of a method of shaping an elongate element (e.g., wire) with the shaping tool of FIG. 5A, according to the invention.

Figure 6:
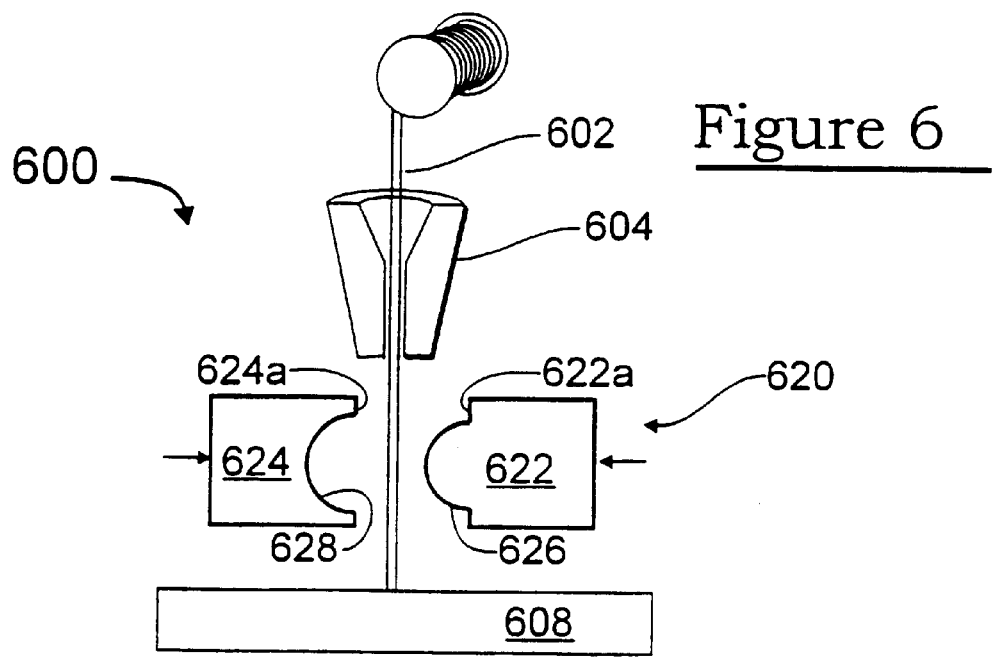

FIG. 6 is a perspective view of wirebonding apparatus, including another embodiment of an external shaping tool, according to the invention.

Figure 6A:
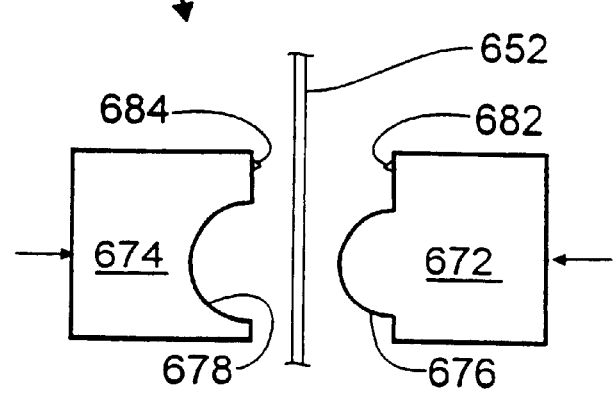

FIG. 6A is a side view of a method of shaping an elongate element (e.g., wire) with the shaping tool of FIG. 6, including a feature of the shaping tool for nicking or severing the elongate element, according to the invention.

Figure 6B:
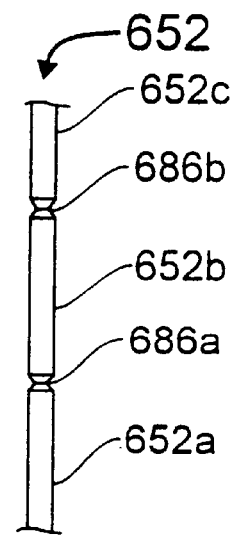

FIG. 6B is a side view of an elongate element that has been nicked to define a series of shaped elongate elements which are linked end-to-end, according to the invention.

Figure 7:
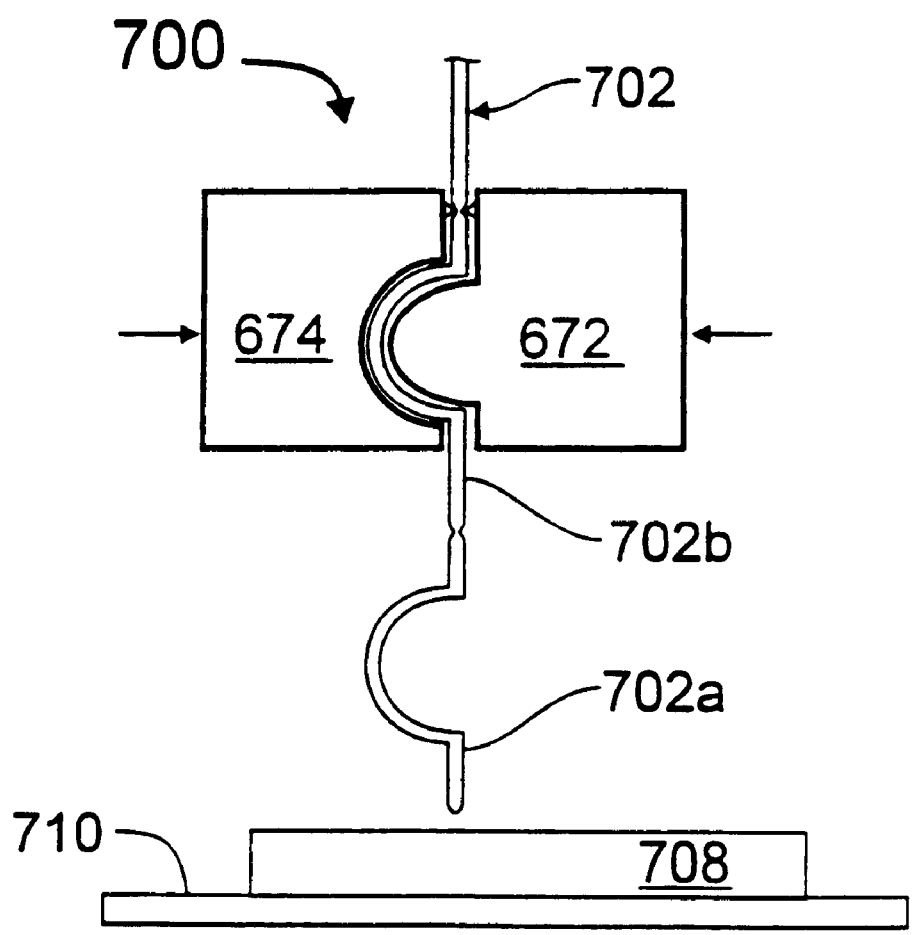

FIG. 7 is a side view of a technique for inserting a plurality of shaped elongate elements into a substrate, according to the invention.

DETAILED DESCRIPTION OF THE INVENTION

The disclosure of the aforementioned U.S. patent application Ser. Nos. 08/452,255 and 08/573,945 are incorporated by reference herein. This patent application summarizes several of the techniques disclosed therein.

An important aspect of the invention is that a composite interconnection element can be formed by starting with a core (which may be mounted to a terminal of an electronic component), then overcoating the core with an appropriate material to: (1) establish the mechanical properties of the resulting "composite" interconnection element; and/or (2)

when the interconnection element is mounted to a terminal of an electronic component, securely anchor the interconnection element to the terminal. In this manner, a resilient interconnection element (spring element) can be fabricated, starting with a core of a soft material which is readily shaped into a springable shape and which is readily attached to even the most fragile of electronic components. In light of prior art techniques of forming spring elements from hard materials, is not readily apparent, and is arguably counter-intuitive, that soft materials can form the basis of spring elements. Such a "composite" interconnection element is generally the preferred form of resilient contact structure for use in the embodiments of the invention.

FIGS. 1A, 1B, 1C and 1D illustrate, in a general manner, various shapes for composite interconnection elements, according to the invention.

In the main, hereinafter, composite interconnection elements which exhibit resiliency are described. However, it should be understood that non-resilient composite interconnection elements fall within the scope of the invention.

Further, in the main hereinafter, composite interconnection elements that have a soft (readily shaped, and amenable to affixing by friendly processes to electronic components) core, overcoated by hard (springy) materials are described. It is, however, within the scope of the invention that the core can be a hard material—the overcoat serving primarily to securely anchor the interconnection element to a terminal of an electronic component.

In FIG. 1A, an electrical interconnection element 110 includes a core 112 of a "soft" material (e.g., a material having a yield strength of less than 40,000 psi), and a shell (overcoat) 114 of a "hard" material (e.g., a material having a yield strength of greater than 80,000 psi). The core 112 is an elongate element shaped (configured) as a substantially straight cantilever beam, and may be a wire having a diameter of 0.0005–0.0030 inches (0.001 inch=1 mil~25 microns ($\mu$m )). The shell 114 is applied over the already-shaped core 112 by any suitable process, such as by a suitable plating process (e.g., by electrochemical plating).

FIG. 1A illustrates what is perhaps the simplest of spring shapes for an interconnection element of the invention—namely, a straight cantilever beam oriented at an angle to a force "F" applied at its tip 110*b*. When such a force is applied by a terminal of an electronic component to which the interconnection element is making a pressure contact, the downward (as viewed) deflection of the tip will evidently result in the tip moving across the terminal, in a "wiping" motion. Such a wiping contact ensures a reliable contact being made between the interconnection element and the contacted terminal of the electronic component.

By virtue of its "hardness", and by controlling its thickness (0.00025–0.00500 inches), the shell 114 imparts a desired resiliency to the overall interconnection element 110. In this manner, a resilient interconnection between electronic components (not shown) can be effected between the two ends 110*a* and 110*b* of the interconnection element 110. (In FIG. 1A, the reference numeral 110*a* indicates an end portion of the interconnection element 110, and the actual end opposite the end 110*b* is not shown.) In contacting a terminal of an electronic component, the interconnection element 110 would be subjected to a contact force (pressure), as indicated by the arrow labelled "F".

It is generally preferred that the thickness of the overcoat (whether a single layer or a multi-layer overcoat) be thicker than the diameter of the wire being overcoated. Given the fact that the overall thickness of the resulting contact structure is the sum of the thickness of the core plus twice the thickness of the overcoat, an overcoat having the same thickness as the core (e.g., 1 mil) will manifest itself, in aggregate, as having twice the thickness of the core.

The interconnection element (e.g., 110) will deflect in response to an applied contact force, said deflection (resiliency) being determined in part by the overall shape of the interconnection element, in part by the dominant (greater) yield strength of the overcoating material (versus that of the core), and in part by the thickness of the overcoating material.

As used herein, the terms "cantilever" and "cantilever beam" are used to indicate that an elongate structure (e.g., the overcoated core 112) is mounted (fixed) at one end, and the other end is free to move, typically in response to a force acting generally transverse to the longitudinal axis of the elongate element. No other specific or limiting meaning is intended to be conveyed or connoted by the use of these terms.

In FIG. 1B, an electrical interconnection element 120 similarly includes a soft core 122 (compare 112) and a hard shell 124 (compare 114). In this example, the core 122 is shaped to have two bends, and thus may be considered to be S-shpaed. As in the example of FIG. 1A, in this manner, a resilient interconnection between electronic components (not shown) can be effected between the two ends 120*a* and 120*b* of the interconnection element 120. (In FIG. 1B, reference numeral 120*a* indicates an end portion of the interconnection element 120, and the actual end opposite the end 120*b* is not shown.) In contacting a terminal of an electronic component, the interconnection element 120 would be subjected to a contact force (pressure), as indicated by the arrow labelled "F".

In FIG. 1C, an electrical interconnection element 130 similarly includes a soft core 132 (compare 112) and a hard shell 134 (compare 114). In this example, the core 132 is shaped to have one bend, and may be considered to be U-shaped. As in the example of FIG. 1A, in this manner, a resilient interconnection between electronic components (not shown) can be effected between the two ends 130*a* and 130*b* of the interconnection element 130. (In FIG. 1C, the reference numeral 130*a* indicates an end portion of the interconnection element 130, and the actual end opposite the end 130*b* is not shown.) In contacting a terminal of an electronic component, the interconnection element 130 could be subjected to a contact force (pressure), as indicated by the arrow labelled "F". Alternatively, the interconnection element 130 could be employed to make contact at other than its ends 130*b*, as indicated by the arrow labelled "F'".

FIG. 1D illustrates another embodiment of a resilient interconnection element 140 having a soft core 142 and a hard shell 144. In this example, the interconnection element 140 is essentially a simple cantilever (compare FIG. 1A), with a curved tip 140*b*, subject to a contact force "F" acting transverse to its longitudinal axis.

FIG. 1E illustrates another embodiment of a resilient interconnection element 150 having a soft core 152 and a hard shell 154. In this example, the interconnection element 150 is generally "C-shaped", preferably with a slightly curved tip 150*b*, and is suitable for making a pressure contact as indicated by the arrow labelled "F".

It should be understood that the soft core can readily be formed into any springable shape—in other words, a shape that will cause a resulting interconnection element to deflect resiliently in response to a force applied at its tip. For example, the core could be formed into a conventional coil shape. However, a coiled shape would not be preferred, due to the overall length of the interconnection element and inductances (and the like) associated therewith and the adverse effect of same on circuitry operating at high frequencies (speeds).

The material of the shell, or at least one layer of a multi-layer shell (described hereinbelow) has a significantly higher yield strength than the material of the core. Therefore, the shell overshadows the core in establishing the mechanical characteristics (e.g., resiliency) of the resulting interconnection structure. Ratios of shell:core yield strengths are preferably at least 2:1, including at least 3:1 and at least 5:1, and may be as high as 10:1. It is also evident that the shell, or at least an outer layer of a multi-layer shell should be electrically conductive, notably in cases where the shell covers the end of the core. (The parent case, however, describes embodiments where the end of the core is exposed, in which case the core must be conductive.)

From an academic viewpoint, it is only necessary that the springing (spring shaped) portion of the resulting composite interconnection element be overcoated with the hard material. From this viewpoint, it is generally not essential that both of the two ends of the core be overcoated. As a practical matter, however, it is preferred to overcoat the entire core. Particular reasons for and advantages accruing to overcoating an end of the core which is anchored (attached) to an electronic component are discussed in greater detail hereinbelow.

Suitable materials for the core (112, 122, 132, 142) include, but are not limited to: gold, aluminum, copper, and their alloys. These materials are typically alloyed with small amounts of other metals to obtain desired physical properties, such as with beryllium, cadmium, silicon, magnesium, and the like. It is also possible to use silver, palladium, platinum; metals or alloys such as metals of the platinum group of elements. Solder constituted from lead, tin, indium, bismuth, cadmium, antimony and their alloys can be used.

Vis-a-vis attaching an end of the core (wire) to a terminal of an electronic component (discussed in greater detail hereinbelow), generally, a wire of any material (e.g., gold) that is amenable to bonding (using temperature, pressure and/or ultrasonic energy to effect the bonding) would be suitable for practicing the invention. It is within the scope of this invention that any material amenable to overcoating (e.g., plating), including non-metallic material, can be used for the core.

Suitable materials for the shell (114, 124, 134, 144) include (and, as is discussed hereinbelow, for the individual layers of a multi-layer shell), but are not limited to: nickel, and its alloys; copper, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the platinum group and their alloys; tungsten and molybdenum. In cases where a solder-like finish is desired, tin, lead, bismuth, indium and their alloys can also be used.

The technique selected for applying these coating materials over the various core materials set forth hereinabove will, of course, vary from application-to-application. Electroplating and electroless plating are generally preferred techniques. Generally, however, it would be counterintuitive to plate over a gold core. According to an aspect of the invention, when plating (especially electroless plating) a nickel shell over a gold core, it is desirable to first apply a thin copper initiation layer over the gold wire stem, in order to facilitate plating initiation.

An exemplary interconnection element, such as is illustrated in FIGS. 1A–1E may have a core diameter of approximately 0.001 inches and a shell thickness of 0.001 inches—the interconnection element thus having an overall diameter of approximately 0.003 inches (i.e., core diameter plus two times the shell thickness). Generally, this thickness of the shell will be on the order of 0.2–5.0 (one-fifth to five times the thickness (e.g., diameter) of the core.

Some exemplary parameters for composite interconnection elements are:

(a) A gold wire core having a diameter of 1.5 mils is shaped to have an overall height of 40 mils and a generally C-shaped curve (compare FIG. 1E) of 9 mils radius, is plated with 0.75 mils of nickel (overall diameter=1.5+2×0.75=3 mils), and optional receives a final overcoat of 50 microinches of gold (e.g., to lower and enhance contact resistance). The resulting composite interconnection element exhibits a spring constant (k) of approximately 3–5 grams/mil. In use, 3–5 mils of deflection will result in a contact force of 9–25 grams. This example is useful in the context of a spring element for an interposer.

(b) A gold wire core having a diameter of 1.0 mils is shaped to have an overall height of 35 mils, is plated with 1.25 mils of nickel (overall diameter=1.0+2× 1.25=3.5 mils), and optionally receives a final overcoat of 50 microinches of gold. The resulting composite interconnection element exhibits a spring constant (k) of approximately 3 grams/mil, and is useful in the context of a spring element for a probe.

(c) A gold wire core having a diameter of 1.5 mils is shaped to have an overall height of 20 mils and a generally S-shape curve with radii of approximately 5 mils, is plated with 0.75 mils of nickel or copper (overall diameter=1.5+2×0.75=3 mils). The resulting composite interconnection element exhibits a spring constant (k) of approximately 2–3 grams/mil, and is useful in the context of a spring element for mounting on a semiconductor device.

The core need not have a round cross-section, but may rather be a flat tab (having a rectangular cross-section) extending from a sheet. It should be understood that, as used herein, the term "tab" is not to be confused with the term "TAB" (Tape Automated Bonding).

MULTI-LAYER SHELLS

FIG. 2A illustrates an embodiment 200 of an interconnection element 210 mounted to an electronic component 212 which is provided with a terminal 214. In this example, a soft (e.g., gold) wire core 216 is bonded (attached) at one end 216a to the terminal 214, is configured to extend from the terminal and have a spring shape (compare the shape shown in FIG. 1B), and is severed to have a free end 216b. Bonding, shaping and severing a wire in this manner is accomplished using wirebonding equipment. The bond at the end 216a of the core covers only a relatively small portion of the exposed surface of the terminal 214.

A shell (overcoat) is disposed over the wire core 216 which, in this example, is shown as being multi-layered, having an inner layer 218 and an outer layer 220, both of which layers may suitable be applied by plating processes. One or more layers of the multi-layer shell is (are) formed of a hard material (such as nickel and its alloys) to impart a desired resiliency to the interconnection element 210. For example, the outer layer 220 may be of a hard material, and the inner layer may be of a material that acts as a buffer or barrier layer (or as an activation layer, or as an adhesion layer) in plating the hard material 220 onto the core material 216. Alternatively, the inner layer 218 may be the hard material, and the outer layer 220 may be a material (such as soft gold) that exhibits superior electrical characteristics, including electrical conductivity and solderability. When a solder or braze type contact is desired, the outer layer of the interconnection element may be lead-tin solder or gold-tin braze material, respectively.

ANCHORING TO A TERMINAL

FIG. 2A illustrates, in a general manner, another key feature of the invention—namely, that resilient interconnection element can be securely anchored to a terminal on an electronic component. The attached end 210a of the interconnection element will be subject to significant mechanical stress, as a result of a compressive force (arrow "F") applied to the free end 210b of the interconnection element.

As illustrated in FIG. 2A, the overcoat (218, 220) covers not only the core 216, but also the entire remaining (i.e., other than the bond 216a)exposed surface of the terminal 214 adjacent the core 216 in a continuous (non-interrupted) manner. This securely and reliably anchors the interconnection element 210 to the terminal, the overcoat material providing a substantial (e.g., greater that 50%) contribution to anchoring the resulting interconnection element to the terminal. Generally, it is only required that the overcoat material cover at least a portion of the terminal adjacent the core. It is generally preferred, however, that the overcoat material cover the entire remaining surface of the terminal. Preferably, each layer of the shell is metallic.

As a general proposition, the relatively small area at which the core is attached (e.g., bonded) to the terminal is not well suited to accommodating stresses resulting from contact forces ("F") imposed on the resulting composite interconnection element. By virtue of the shell covering the entire exposed surface of the terminal (other than in the relatively small area comprising the attachment of the core end 216a to the terminal), the overall interconnection structure is firmly anchored to the terminal. The adhesion strength, and ability to react contact forces, of the overcoat will far exceed that of the core end (216a) itself.

As used herein, the term "electronic component" (e.g., 212) includes, but is not limited to: interconnect and interposer substrates; semiconductor wafers and dies, made of any suitable semiconducting material such as silicon (Si) or gallium-arsenide (GaAs); production interconnect sockets; test sockets; sacrificial members, elements and substrates, as described in the parent case; semiconductor packages, including ceramic and plastic packages, and chip carriers; and connectors.

The interconnection element of the invention is particularly well suited for use as:

interconnection elements mounted directly to silicon dies, eliminating the need for having a semiconductor package;

interconnection elements extending as probes from substrates (described in greater detail hereinbelow) for testing electronic components; and interconnection elements of interposers (discussed in greater detail hereinbelow).

The interconnection element of the invention is unique in that it benefits from the mechanical characteristics (e.g., high yield strength) of a hard material without being limited by the attendant typically poor bonding characteristic of hard materials. As elaborated upon in the parent case, this is made possible largely by the fact that the shell (overcoat) functions as a "superstructure" over the "falsework" of the core, two terms which are borrowed from the milieu of civil engineering. This is very different from plated interconnection elements of the prior art wherein the plating is used as a protective (e.g., anti-corrosive) coating, and is generally incapable of imparting the desired mechanical characteristic to the interconnection structure. And this is certainly in marked contrast to any non-metallic, anticorrosive coatings, such as benzotriazole (BTA) applied to electrical interconnects.

Among the numerous advantages of the invention are that a plurality of free-standing interconnect structures are readily formed on substrates, from different levels thereof such as a PCB having a decoupling capacitor) to a common height above the substrate, so that their free ends are coplanar with one another. Additionally, both the electrical and mechanical (e.g., plastic and elastic) characteristics of an interconnection element formed according to the invention are readily tailored for particular applications. For example, it may be desirable in a given application that the interconnection elements exhibit both plastic and elastic deformation. (Plastic deformation may be desired to accommodate gross non-planarities in components being interconnected by the interconnection elements.) When elastic behavior is desired, it is necessary that the interconnection element generate a threshold minimum amount of contact force to effect a reliable contact. It is also advantageous that the tip of the interconnection element makes a wiping contact with a terminal of an electronic component, due to the occasional presence of contaminant films on the contacting surfaces.

As used herein, the term "resilient", as applied to contact structures, implies contact structures (interconnection elements) that exhibit primarily elastic behavior in response to an applied load (contact force), and the term "compliant" implies contact structures (interconnection elements) that exhibit both elastic and plastic behavior in response to an applied load (contact force). As used herein, a "compliant" contact structure is a "resilient" contact structure. The composite interconnection elements of the invention are a special case of either compliant or resilient contact structures.

A number of features are elaborated upon in detail, in the parent case, including, but not limited to: fabricating the interconnection elements on sacrificial substrates; gang-transferring a plurality of interconnection elements to an electronic component; providing the interconnection elements with contact tips, preferably with a rough surface finish; employing the interconnection elements on an electronic component to make temporary, then permanent connections to the electronic component; arranging the interconnection elements to have different spacing at their one ends than at their opposite ends; fabricating spring clips and alignment pins in the same process steps as fabricating the interconnection elements; employing the inconnection elements to accommodate differences in thermal expansion between connected components; eliminating the need for discrete semiconductor packages (such as for SIMMs); and optionally soldering resilient interconnection elements (resilient contact structures).

CONTROLLED IMPEDANCE

FIG. 2B shows a composite interconnection element 220 having multiple layers. An innermost portion (inner elongate conductive element) 222 of the interconnection element 220 is either an uncoated core or a core which has been overcoated, as described hereinabove. The tip 222b of the innermost portion 222 is masked with a suitable masking material (not shown). A dielectric layer 224 is applied over the innermost portion 222 such as by an electrophoretic process. An outer layer 226 of a conductive material is applied over the dielectric layer 224.

In use, electrically grounding the outer layer 226 will result in the interconnection element 220 having controlled impedance. An exemplary material for the dielectric layer 224 is a polymeric material, applied in any suitable manner and to any suitable thickness (e.g., 0.1–3.0 mils).

The outer layer 226 may be multi-layer. For example, in instances wherein the innermost portion 222 is an uncoated core, at least one layer of the outer layer 226 is a spring material, when it is desired that the overall interconnection element exhibit resilience.

ALTERING PITCH

FIG. 2C illustrates an embodiment 250 wherein a plurality (six of many shown) of interconnection elements 251 . . . 256 are mounted on a surface of an electronic component 260, such as a probe card insert (a subassembly mounted in a conventional manner to a probe card). Terminals and conductive traces of the probe card insert are omitted from this view, for illustrative clarity. The attached ends 251a . . . 256a of the interconnection elements 251 . . . 256 originate at a first pitch (spacing), such as 0.050–0.100 inches. The interconnection elements 251 . . . 256 are shaped and/or oriented so that their free ends (tips) are at a second, finer pitch, such as 0.005–0.010 inches. An interconnect assembly which makes interconnections from a one pitch to another pitch is typically referred to as a "space transformer".

As illustrated, the tips 251b . . . 256b of the interconnection elements are arranged in two parallel rows, such as for making contact to (for testing and/or burning in) a semiconductor device having two parallel rows of bond pads (contact points). The interconnection elements can be arranged to have other tip patterns, for making contact to electronic components having other contact point patterns, such as arrays.

Generally, throughout the embodiments disclosed herein, although only one interconnection element may be shown, the invention is applicable to fabricating a plurality of interconnection components and arranging the plurality of interconnection elements in a prescribed spatial relationship with one another, such as in a peripheral pattern or in a rectangular array pattern.

USE OF SACRIFICIAL SUBSTRATES

The mounting of interconnection elements directly to terminals of electronic components has been discussed hereinabove. Generally speaking, the interconnection elements of the invention can be fabricated upon, or mounted to, any suitable surface of any suitable substrate, including sacrificial substrates.

Attention is directed to the PARENT CASE, which describes, for example with respect to FIGS. 11A–11F fabricating a plurality of interconnection structures (e.g., resilient contact structures) as separate and distinct structures for subsequent mounting to electronic components, and which describes with respect to FIGS. 12A–12C mounting a plurality of interconnection elements to a sacrificial substrate (carrier) then transferring the plurality of interconnection elements en masse to an electronic component.

FIGS. 2D–2F illustrate a technique for fabricating a plurality of interconnection elements having preformed tip structures, using a sacrificial substrate.

FIG. 2D illustrates a first step of the technique 250, in which a patterned layer of masking material 252 is applied onto a surface of a sacrificial substrate 254. The sacrificial substrate 254 may be of thin (1–10 mil) copper or aluminum foil, by way of example, and the masking material 252 may be common photoresist. The masking layer 252 is patterned to have a plurality (three of many shown) of openings at locations 256a, 256b, 256c whereat it is desired to fabricate interconnection elements. The locations 256a, 256b and 256c are, in this sense, comparable to the terminals of an electronic component. The locations 256a, 256b and 256c are preferably treated at this stage to have a rough or featured surface texture. As shown, this may be accomplished mechanically with an embossing tool 257 forming depressions in the foil 254 at the locations 256a, 256b and 256c. Alternatively, the surface of the foil at these locations can be chemically etched to have a surface texture. Any technique suitable for effecting this general purpose is within the scope of this invention, for example sand blasting, peening and the like.

Next, a plurality (one of many shown) of conductive tip structures 258 are formed at each location (e.g., 256b), as illustrated by FIG. 2E. This may be accomplished using any suitable technique, such as electroplating, and may include tip structures having multiple layer of material. For example, the tip structure 258 may have a thin (e.g., 10–100 microinch) barrier layer of nickel applied onto the sacrificial substrate, followed by a thin (e.g., 10 microinch) layer of soft gold, followed by a thin (e.g., 20 microinch) layer of hard gold, followed by a relatively thick (e.g., 200 microinch) layer of nickel, followed by a final thin (e.g., 100 microinch) layer of soft gold. Generally, the first thin barrier layer of nickel is provided to protect the subsequent layer of gold from being "poisoned" by the material (e.g., aluminum, copper) of the substrate 254, the relatively thick layer of nickel is to provide strength to the tip structure, and the final thin layer of soft gold provides a surface which is readily bonded to. The invention is not limited to any particulars of how the tip structures are formed on the sacrificial substrate, as these particulars would inevitably vary from application-to-application.

As illustrated by FIG. 2E, a plurality (one of many shown) of cores 260 for interconnection elements may be formed on the tip structures 258, such as by any of the techniques of bonding a soft wire core to a terminal of an electronic component described hereinabove. The cores 260 are then overcoated with a preferably hard material 262 in the manner described hereinabove, and the masking material 252 is then removed, resulting in a plurality (three of many shown) of free-standing interconnection elements 264 mounted to a surface of the sacrificial substrate, as illustrated by FIG. 2F.

In a manner analogous to the overcoat material covering at least the adjacent area of a terminal (214) described with respect to FIG. 2A, the overcoat material 262 firmly anchors the cores 260 to their respective tip structures 258 and, if desired, imparts resilient characteristics to the resulting interconnection elements 264. As noted in the PARENT CASE, the plurality of interconnection elements mounted to the sacrificial substrate may be gang-transferred to terminals of an electronic component. Alternatively, two widely divergent paths may be taken.

It is within the scope of this invention that a silicon wafer can be used as the sacrificial substrate upon which tip structures are fabricated, and that tip structures so fabricated may be joined (e.g., soldered, brazed) to resilient contact structures which already have been mounted to an electronic component.

As illustrated by FIG. 2G, the sacrificial substrate 254 may simply be removed, by any suitable process such as selective chemical etching. Since most selective chemical etching processes will etch one material at a much greater rate than an other material, and the other material may slightly be etched in the process, this phenomen is advantageously employed to remove the thin barrier layer of nickel in the tip structure contemporaneously with removing the sacrificial substrate. However, if a need be, the thin nickel barrier layer can be removed in a subsequent etch step. This results in a plurality (three of many shown) of individual, discrete, singulated interconnection elements 264, as indicated by the dashed line 266, which may later be mounted (such as by soldering or brazing) to terminals on electronic components.

It bears mention that the overcoat material may also be slightly thinned in the process of removing the sacrificial substrate and/or the thin barrier layer. However, it is preferred that this not occur.

To prevent thinning of the overcoat, it is preferred that a thin layer of gold or, for example, approximately 10 microinches of soft gold applied over approximately 20 microinches of hard gold, be applied as a final layer over the overcoat material 262. Such an outer layer of gold is intended primarily for its superior conductivity, contact resistance, and solderability, and is generally highly impervious to most etching solutions contemplated to be used to remove the thin barrier layer and the sacrificial substrate.

Alternatively, as illustrated by FIG. 2H, prior to removing the sacrificial substrate 254, the plurality (three of many shown) of interconnection elements 264 may be "fixed" in a desired spatial relationship with one another by any suitable support structure 266, such as by a thin plate having a plurality of holes therein, whereupon the sacrificial substrate is removed. The support structure 266 may be of a dielectric material, or of a conductive material overcoated with a dielectric material. Further processing steps (not illustrated) such as mounting the plurality of interconnection elements to an electronic component such as a silicon wafer or a printed circuit board may then proceed. Additionally, in some applications, it may be desirable to stabilize the tips (opposite the tip structures) of the interconnection elements 264 from moving, especially when contact forces are applied thereto. To this end, it may also be desirable to constrain movement of the tips of the interconnection elements with a suitable sheet 268 having a plurality of holes, such as mesh formed of a dielectric material.

A distinct advantage of the technique 250 described hereinabove is that tip structures (258) may be formed of virtually any desired material and having virtually any desired texture. As mentioned hereinabove, gold is an example of a noble metal that exhibits excellent electrical characteristics of electrical conductivity, low contact resistance, solderability, and resistance to corrosion. Since gold is also malleable, it is extremely well-suited to be a final overcoat applied over any of the interconnection elements described herein, particularly the resilient interconnection elements described herein. Other noble metals exhibit similar desirable characteristics. However, certain materials such as rhodium which exhibit such excellent electrical characteristics would generally be inappropriate for overcoating an entire interconnection element. Rhodium, for example, is notablly brittle, and may not perform well as a final overcoat on a resilient interconnection element. In this regard, techniques exemplified by the technique 250 readily overcome this limitation. For example, the first layer of a multi-layer tip structure (see 258) can be rhodium (rather than gold, as described hereinabove), thereby exploiting its superior electrical characteristics for making contact to electronic components without having any impact whatsoever on the mechanical behavior of the resulting interconnect element.

FIG. 2I illustrates an alternate embodiment 270 for fabricating interconnection elements. In this embodiment, a masking material 272 is applied to the surface of a sacrificial substrate 274, and is patterned to have a plurality (one of many shown) of openings 276, in a manner similar to the technique described hereinabove with respect to FIG. 2D. The openings 276 define areas whereat interconnection elements will be fabricated as free-standing structures. (As used throughout the descriptions set forth herein, an interconnection element is "free-standing" when is has a one bonded to a terminal of an electronic component or to an area of a sacrificial substrate, and the opposite end of the interconnection element is not bonded to the electronic component or sacrificial substrate.)

The area within the opening may be textured, in any suitable manner, such as to have one or more depressions, as indicated by the single depression 278 extending into the surface of the sacrificial substrate 274.

A core (wire stem) 280 is bonded to the surface of the sacrificial substrate within the opening 276, and may have any suitable shape. In this illustration, only a one end of one interconnection element is shown, for illustrative clarity. The other end (not shown) may be attached to an electronic component. It may not readily be observed that the technique 270 differs from the aforementioned technique 250 in that the core 280 is bonded directly to the sacrificial substrate 274, rather than to a tip structure 258. By way of example, a gold wire core (280) is readily bonded, using conventional wirebonding techniques, to the surface of an aluminum substrate (274).

In a next step of the process (270), a layer 282 of gold is applied (e.g., by plating) over the core 280 and onto the exposed area of the substrate 274 within the opening 276, including within the depression 278. The primary purpose of this layer 282 is to form a contact surface at the end of the resulting interconnection element (i.e., once the sacrificial substrate is removed).

Next, a layer 284 of a relatively hard material, such as nickel, is applied over the layer 282. As mentioned hereinabove, one primary purpose of this layer 284 is to impart desired mechanical characteristics (e.g., resiliency) to the resulting composite interconnection element. In this embodiment, another primary purpose of the layer 284 is to enhance the durability of the contact surface being fabricated at the lower (as viewed) end of the resulting interconnection element. A final layer of gold (not shown) may be applied over the layer 284, to enhance the electrical characteristics of the resulting interconnection element.

In a final step, the masking material 272 and sacrificial substrate 274 are removed, resulting in either a plurality of singulated interconnection elements (compare FIG. 2G) or in a plurality of interconnection elements having a predetermined spatial relationship with one another (compare FIG. 2H).

This embodiment 270 is exemplary of a technique for fabricating textured contact tips on the ends of interconnection elements. In this case, an excellent example of a "gold over nickel" contact tip has been described. It is, however, within the scope of the invention that other analogous contact tips could be fabricated at the ends of interconnection elements, according to the techniques described herein. Another feature of this embodiment 270 is that the contact tips are constructed entirely atop the sacrificial substrate (274), rather than within the surface of the sacrificial substrate (254) as contemplated by the previous embodiment 250.

SHAPING THE CORE ELEMENT BY MOVING THE COMPONENT

FIG. 3, corresponds generally to FIG. 2 of the PARENT CASE, and is a perspective view of a wire, having had its free end bonded to a substrate (which may be an electronic component), and configured to have a springable shape.

In this example, a wire 302 (compare 122, 132, 142, 152) has had its free ends 302a bonded within a defined contact area 310 (which may be a terminal of an electronic component) on a surface 308a of a substrate 308, according to any of the techniques hereinabove. An initial position of the capillary 304 is shown in dashed lines. A final position of the capillary 304 is shown in solid lines. The surface 308a of the substrate 308 lies in an x-y plane (although the overall surface of the substrate is not required to be planar). The final position of the capillary 304 is shown in FIG. 3, in solid lines, as being displaced from the surface of the substrate in a positive z-direction. The wire 302 is fed from a supply spool 306 through the capillary 304, and is configured (to have a shape) in the following manner.

The free (proximal) end 302a of the wire 302 is bonded to the surface 308a of the substrate 308 at a point labelled "a", with the capillary 304 in its initial (dashed line) position. The capillary 304 is then moved along a trajectory of points, which are "generically" labelled "b", "c", and "d" in FIG. 3, to shape the wire in two or in three dimensions.

For the sake of descriptive clarity, movement of the capillary is discussed as indicative of relative motion between the substrate and the capillary. Often, movements in the x- and y-directions are achieved by moving the substrate (e.g., an x-y table to which the substrate is mounted), and movements in the z-direction are achieved by moving the capillary. Generally, the capillary is usually oriented in the z-axis. However, it is within the scope of this invention that capillaries with many degrees of freedom could be employed to configure the shape of the wire stem.

Generally, movement of the capillary 304 is effected by a positioning mechanism (POSN) 320 under the control of a microprocessor-based controller (CONTROL) 322, and is linked to the capillary 304 by any suitable linkage 324.

When the capillary has reached its final (solid line) position, the wire 302 is severed. This is illustrated in FIG. 3 by an EFO (electronic flame off) electrode 332 positioned adjacent the capillary 304, the electrode 332 receiving electrical energy from an electronic flame-off (EFO) circuit 334 which is operated under control of the controller 322.

As is discussed in the PARENT CASE, as well as in the aforementioned U.S. patent application Ser. No. 08/573,945, the operation of severing of the wire (e.g., by electronic flame-off) can be enhanced by providing ultraviolet light directed at the cutoff position (position "d" in FIG. 3) from an appropriate (e.g., ultraviolet) light source (not shown).

It is well known that the EFO electrode 332 can be moved towards and away from the capillary 304 by means of actuators and linkages (not shown) under the direction of the control mechanism 322.

USING A SHAPING TOOL TO SHAPE THE CORE ELEMENT

Generally, in order to fabricate a composite interconnection element, one must start with a core element that is readily shaped to have a springable shape. Inasmuch as it is preferred that the core element be of a material that is shapable, it is generally required to overcoat such an "inchoate" resilient structure to arrive at usable resilient contact structure (composite interconnection element). The core element is a "precursor" to the resulting composite interconnection element.

In the PARENT CASE, inter alia, certain improvements in wirebonding have been disclosed, such as providing ultrasonic energy during playing a wire out of a capillary of a wirebonder and/or flowing gas through the capillary to overcome stiction of the wire as it plays out of the capillary. Overcoming these problems is substantially avoided by the present invention. Additionally, the phenomenon of stiction is advantageously employed by the techniques of the present invention.

Generally, as described hereinabove, once the free (proximal) end of the wire has been bonded to the terminal, the capillary is moved generally upward (in a z-axis direction) from the surface of the component upon which the terminal resides and the component, which typically is mounted to an x-y table (not shown) is moved in the x- and y-directions. This imparts a relative motion between the capillary and the component which is suitably employed to shape the wire stem (core element). As the capillary moves, the wire "plays out" of the end of the capillary, and the relative motion between the capillary and the substrate is controlled, and imparts a desired shape to the wire.

Stiction of the wire as it plays out of the capillary is but one of the problems that may be encountered when employing such techniques. Other problems include, drag in the capillary, speed, uniformity, and the like.

According to the present invention, these difficulties can be overcome by employing external (other than relative motion of the capillary) instrumentalities to shape the wire stem.

The concept of using an external tool to shape the wire stem can be found in the aforementioned commonly-owned U.S. Patent Applications, For example, in U.S. patent application Ser. No. 08/452,255 it is disclosed at page 260 that:

"It is within the scope of this invention that the shaping of the wire stem is augmented, or fully implemented by external means other than [relative] movement of the capillary."

FIG. 4A illustrates a technique 400 of shaping an elongate element such as a bond wire 402 (compare 302) that has already been bonded at one end 402a (compare 302a) thereof, by a capillary of a wirebonder, to an area of a substrate such as a terminal (shown as a dashed line area 410, compare 310) on a surface 408a (compare 308a) of an electronic component 408 (compare 308), or at a position on any substrate, including a sacrificial substrate, including a position whereat a tip structure has previously been formed. The wire 402 is supplied by a supply spool 406 (compare 306) of a wirebonder (not shown).

In FIG. 4A, the capillary 404 is shown as having been lifted (withdrawn) straight up (along the z-axis) off of the surface of the surface of the substrate so that a portion of the wire 402 extends in a substantially straight line between the component 408 and the tip (bottom end, as viewed) of the capillary 404, generally normal to the surface 408a of the component 408.

For the purpose of forming an inchoate composite interconnection element, it is desired to shape this portion of the wire (elongate element) between the capillary and the component to have a spring shape, for subsequent overcoating as described hereinabove. To achieve this purpose, a shaping tool 412 is provided, and may conveniently be attached to the same linkage (mechanism, not shown) that moves the EFO electrode 432 (compare 332) into and away from the capillary. The EFO electrode 432 may be disposed upon the shaping tool 412, so that they move in unison, or it may not.

The shaping tool 412 is in the form of an elongate element having a blunt front end (towards the left, in the figure). In this case, the blunt front end is semicircular. The shaping tool 412 has a thickness (into the page, as viewed in the figure) which is at least as great as the thickness (diameter, in the case of a round wire) of the core element 402. Preferably, the thickness of the shaping tool is at least twice as large as the thickness of the core element.

After the end of the wire is bonded to the component, and the capillary is withdrawn, the shaping tool 412 is urged against the wire, approximately at a midpoint between the component and the capillary, in a direction which is generally parallel to the surface of the component (in other words, generally transverse to the longitudinal axis of the wire). This results in the wire being deformed (shaped), as illustrated in FIG. 4B. In this example, the wire is shaped to have a shape comparable to the shape shown in FIG. 1E, but any shape may be imparted to the wire in this manner. For example, two shaping tools could be brought to bear upon the wire, from opposite sides of the wire, at different longitudinal positions along the wire, to impart an S-like shape to the wire.

Striction, mentioned hereinabove as being problematic when employing relative movement of the capillary and the substrate to shape the wire stem, is advantageous to the technique of the present invention. When the shaping tool is urged against the stretched-out portion of the wire between the capillary and the substrate, striction will provide a restraining force upon the wire further playing out the capillary, permitting the wire to acquire the desired shape.

After (at the conclusion of) shaping the wire in this manner, the EFO electrode 432 may be activated to sever the wire from the capillary, as illustrated by the spark 414 between the EFO electrode 432 and the wire 402. This results in a free-standing wire stem, as shown in FIG. 4C, which preferably has a ball formed at its free (top, as viewed in the figure) end. Preferably, a ball is also formed at the end of the supply wire extending out of the capillary in preparation for making a subsequent wire bond to the component. The shaping tool 412 (and EFO, if attached thereto) is then withdrawn, as illustrated by FIG. 4C.

Hence, a technique is provided for shaping a bond wire to serve as a core element of a composite interconnection element by use of an external instrumentality (i.e., a shaping tool) rather than by moving the component (relative to the capillary) in the x- and y- directions. This is advantageous for the reasons stated above (overcoming striction, etc.), and may be necessary in order to form certain (e.g., fine pitch) arrays of wire stems for composite interconnection elements, depending on the clearances between adjacent wire stems.

Preferably, the shaping tool (412) moves in the plane of the substrate 408 (i.e., in the x or y axis), but it is permissible that there be a downward (towards the surface of the substrate) component of the motion of the shaping tool. Preferably, the tool does not move upward (towards the capillary, away from the substrate) as it is shaping the elongate element (402), since this would tend to pull on the previously-formed bond.

It is within the scope of this invention that the shaping tool (412) perform functions in addition to shaping a played-out wire. For example, it can readily be utilized to bond a midportion of a wire stem to another adjacent structure, such as a bore of a hole in a planar support structure. In such as case, after severing, the two ends of the shaped core element would extend from the two opposite surfaces of the planar support structure, and the shaped elements would be retained therewith, in a fixed spatial relationship to one another.

Another Embodiment of a Shaping Tool

FIGS. 5A–5C illustrate another embodiment 500 of a technique for shaping a portion of an elongate element 502 extending between an area 510 (compare 410) of a substrate 508 (compare 408), such as a terminal of an electronic component, and a capillary 504 (compare 404) of a wirebonder (see FIG. 3). The elongate element 502 is suitably supplied by a supply spool 506 (compare 406).

In this embodiment, as shown in FIG. 5A, the shaping tool 512 (compare 412) is a rod (cylindrical element) that is moved in the x-y plane by an actuator ("ACT") 520 such as a solenoid. The dashed line 522 between the rod and the actuator signified any suitable linkage elements such as levers. Preferably, the actuator 520 is of a type, the motion and position of which can be controlled (e.g., by software), such as a combination motor/encoder or servo system, over its entire range of motion. In this manner, the force applied by the shaping tool to the elongate element and the travel of the shaping tool can be carefully controlled and profiled. It is within the scope of the invention, however, that a simple solenoid can be used as the actuator, the "throw" (distance that the solenoid moves) of the solenoid being limited by a suitable mechanical stop associated with the linkage (or, with the shaping tool itself).

The shaping tool 512 is preferably formed of a material which is harder than the material of the elongate element 502, such as tungsten, quartz, or the like. It is within the scope of this invention that the shaping tool can be heated, such as with an excimer laser, to aid in shaping the elongate element. It is within the scope of this invention that an electrical potential (including grounding) can be applied to the shaping tool for controlling a severing spark applied to the elongate element.

It is within the scope of the invention that the rod (512) is notched or grooved (i.e., in a circumferential direction), to ensure that the wire (502) does not slip (e.g., back and forth along the rod) while the wire is being shaped.

FIG. 5B shows the shaping tool 512 being urged against the elongate element 502, causing the elongate element to have a spring shape. FIG. 5C shows the shaping tool having been withdrawn from the elongate element 502, and the elongate element having been severed adjacent the capillary 504.

In FIGS. 5B and 5C, the elongate element 502 is illustrated as having been caused to have a shape similar to the shape shown in FIG. 1E (a C-shape). The diameter of the shaping tool 512 is preferably slightly less that the final height of the shaped elongate element. For example, a shaped elongate element having height of 30–40 mils can be appropriately shaped by a cylindrical shaping tool having a diameter of 20–25 mils. This is but one of many possible spring shapes that can be imparted to the elongate element.

Preferably, in the embodiment 500, the elongate element 502 is severed by a spark from an electronic flame off (EFO) electrode 532 (compare 332) which is fixed with respect to the capillary 504 (rather than mounted to the shaping tool as in the previously-described embodiment 400).

It is within the scope of this invention that the elongate element is severed with a spark 514 (compare 414), while the shaping tool 512 is in mechanical and electrical contact (engagement) with the elongate element 502, as illustrated in FIG. 5B. The shaping tool 512 could be grounded, or at a given potential to control the spark and/or to prevent the spark from damaging a delicate electronic component (508). This would also be applicable to the previously-described embodiment 400.

In the previously-described embodiments (400, 500) of using a shaping tool (412, 512) to impart a spring shape to the elongate element (e.g., bond wire), the bond wire is first bonded to the substrate and the capillary (404, 504) is withdrawn in the z-axis to feed out the portion of the bond wire which is desired to be shaped.

It is within the scope of this invention that a shaping tool can have a plurality of degrees of freedom, and may be moved in a manner that the elongate element twists around the shaping tool, to impart complex shapes to the shaped portion of the elongate element.

It is within the scope of the invention that the wire stem severed by mechanical means rather than by a spark.

Compound Shaping Tool

In the previously-described embodiments (400, 500) of the invention, the shaping tool (412, 512) deforms the elongate element (402, 502) in a fairly controlled manner, relying solely on plastic deformation of the elongate element for the elongate element to retain its desired shape. Evidently, a limited amount of overtravel may be required to achieve the desired shape, depending upon the material qualities of the elongate element.

FIG. 6 illustrates an embodiment 600 using a two-part shaping tool to impart a spring shape of an elongate element. This embodiment is particularly useful for shaping elongate elements made of materials (e.g., spring materials) having a relatively high yield strength, such as elongate elements that are capable of functioning as monolithic spring elements. As in the previous embodiments (400, 500), it is desired to impart a spring shape to an elongate element 602 (compare 402, 502) which may be (but need not be) bonded at one end to a substrate 608 (compare 408, 508) and which is fed from a capillary 604 (compare 404, 504).

A one part 622 of the two-part shaping tool 620 is an anvil, and another part 624 of the two-part shaping tool 620 is a die (in the mechanical sense). The anvil 622 and die 624 are positioned on opposite sides of the elongate element, and are operatively linked to suitable mechanisms (not shown) for bringing the two parts together (towards one another), as illustrated by the arrows in the figure.

The inner faces 622*a* and 624*a* of the anvil 622 and die 624, are provided with matching mating convex and concave features 626 and 628, respectively. In use, when the anvil and die are brought together, the elongate element 602 acquires the shape of these features.

As in the previous embodiments (400, 500), the elongate element can be severed by a spark while one or both of the anvil and die are in contact with the elongate element.

FIG. 6A illustrates an embodiment 650 of a two-part, "compound" shaping tool comprising an anvil 672 and a die 674 comparable to the previously described anvil and die 622 and 624, respectively.

In this embodiment 650, it is intended to shape and at least notch (nick) an end portion of an elongate element 652 (compare 602) which is not mounted (at one end thereof) to a substrate and which may be supplied by any suitable means (i.e., other than a capillary of a wirebonder). Completely severing the elongate element with the die/anvil is also a possibility. Controlling an electrostatic discharge from an EFO electrode to occur at the nick is also a possibility.

It is within the scope of the invention that a feature is incorporated into the capillary to perform a portion or all of the nicking function. With a wedge bonding tool, this would also be possible. Penetrating a hole (transverse to the bore) in the capillary with a notching tool is also a possibility.

As in the previous embodiment (600), the anvil 672 is provided with a convex feature 676 (compare 626) and the die is provided with a concave feature 678 (compare 628) on their opposing faces so that a desired shape can be imparted to the portion of the elongate element disposed between the die and anvil.

In addition to the above, at least one of the anvil 672 and die 674 is provided with a projecting wedge-shaped feature which is sized and shaped to at least notch (including completely severing) the elongate element. Preferably, both the anvil 672 and die 674 are provided with such features 682 and 684, respectively, as shown in the figure. In this manner, when the anvil and the die are moved towards one another, with the elongate element disposed therebetween, the elongate element is both shaped and notched (optionally, completely severed). If completely severed, a plurality of shaped elongate elements can be formed in this manner. If only notched, a series of shaped elongate elements, connected end-to-end, can be formed in this manner.

FIG. 6B illustrates a series of elongate elements 652*a*, 652*b* and 652*c*, connected end-to-end, separable (e.g., by flexing a one element with respect to the remaining elements) from one another by notches 686*a* (between elements 652*a* and 652*b*) and 686*b* (between elements 652*b* and 652*c*). The elongate elements 652*a*, 652*b* and 652*c* may be shaped, with the shaping tool of FIG. 6 (or of FIG. 6A). They are illustrated without such a shape, for illustrative clarity, but see FIG. 7, hereinbelow.

The nick regions 686*a* and 686*b* are of reduced cross-section. When using a spark (electrical discharge) severing technique (such as from an EFO electrode), the spark severing will occur preferentially at the nick regions of reduced cross-section.

In order to merely notch the elongate element (i.e., as opposed to completely severing the elongate element), the aggregate height (across the page) should be less than the thickness (or diameter, in the case of a wire) of the elongate element.

FIG. 7 shows a technique 700 similar to the aforementioned technique of forming a series of shaped elongate elements (652*a*, 652*b*, 652*c*) which are connected end-to-end, wherein as each elongate element is formed, it is inserted into an area of a relatively soft substrate. In this example, the same anvil 672 and die 674 can be employed as in the previous embodiment 600.

FIG. 7 illustrates an elongate element 702 (compare 652) being fed (downward, as viewed in the figure) through (between) the anvil 672 and die 674. A first shaped elongate element 702*a* is shown as having already been shaped and nicked by the anvil 672 and die 674. A next-in-the-series elongate element 702*b* is shown as being clamped between the anvil 672 and die 674. The end (bottom, as viewed in the figure) of the first shaped element 702*a* may then be inserted, such as by piercing, at a selected position, into or through a selected area on a relatively (relative to the elongate element) soft substrate 708 (including a relatively hard substrate which is provided with relatively soft areas). Then, by imparting relative motion between the substrate 708 and the clamped next elongate element 702*b*, the fist elongate element 702*a* can be separated (singulated) from the elongate element 702. This process of shaping, piercing, moving (singulating) can be repeated at numerous locations on the substrate 708, in order to provide a plurality of shaped elements (702*a*, 702*b*, etc.) at a like plurality of locations on the relatively soft substrate 708, in any desired pattern, such as in an array. In this manner, a plurality of shaped contact elements can be formed and maintained in a defined spatial relationship with one another, for future use (e.g., as an interposer) or processing (e.g., for overcoating the shaped elements).

For example, the elongate element 702 may be a hard copper or invar wire, the substrate may be a ceramic material with a plurality of lithographically defined areas of gold/tin (80/20), the tips of the shaped elements can be fluxed prior to inserting into the gold/tin areas of the substrate and reflow soldered after inserting into the gold tin areas of the substrate, and the like, and the entire array can be plated (overcoated) with gold or the like. A rigid backing plate 710 is suitably provided behind the soft substrate 708.

Alternatively, the shaped elongate elements can be inserted into plated through holes of substrates, including sacrificial substrates.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the invention (including the present invention) most nearly pertains, and such variations are intended to be within the scope of the invention, as disclosed herein. Several of these variations are set forth in the PARENT CASE.

For example, a separate shaping tool can be used in conjunction with techniques other than ball bonding, such as in conjunction with wedge bonding.

For example, the composite interconnection element of the invention can be used as a spring contact for a variety of interposers, a spring contact on silicon, a spring contact having controlled impedance, etc.

For example, it is evidently possible to control the movements of the capillary and the shaping tool so that they are coordinated, according to any desired schedule, with one another. For example, in the technique illustrated in FIGS. 5A–5C, the capillary can move down slightly immediately prior to urging the shaping tool against the played out wire, and can further be moved during the shaping operation, to ensure reliable spring shape formation.

For example, it is evident that the use of a die/anvil combination for shaping (see, e.g., FIGS. 6 and 7) may be difficult to use when it is desired to form a plurality of free-standing spring-shaped elements which are mounted by their one ends to a substrate. It is within the scope of this invention that the capillary is moved in a manner to play out a length of wire (including ribbon-like wire), possibly temporarily securing the free end of wire (if necessary) to achieve this playing-out, moving the capillary out of the way (e.g., lifting the capillary), shaping the played-out portion of the wire with the die/anvil, then lowering the capillary. This is also exemplary of the coordinated motions of the shaping tool and capillary that are readily achieved with the present invention.

What is claimed is:

1. The method of shaping a portion of an elongate element extending away from an area of a substrate, comprising:
   providing a substrate with a surface and an area adjacent the surface of the substrate;
   forming an elongate element connected to and extending from the substrate, the elongate element in a first shape;
   urging a shaping tool against the elongate element to impart a second shape to a second portion of the elongate element;
   providing a bulk conductive material;
   forming the elongate element from the bulk conductive material;
   in conjunction with shaping the elongate element, severing the shaped elongate element from the bulk conductive material; and
   severing the shaped elongate element from the bulk conductive material with a spark.

2. The method, according to claim 1, further comprising:
   providing the spark by an electrode mounted to the shaping tool.

3. The method, according to claim 1, further comprising:
   forming the elongate element using a wirebonder including a capillary, wherein the spark is provided by an electrode mounted in a fixed relationship to the capillary.

4. The method of shaping a portion of an elongate element extending away from an area of a substrate, comprising:
   providing a substrate with a surface and an area adjacent the surface of the substrate;
   forming an elongate element connected to and extending from the substrate, the elongate element in a first shape;
   urging a shaping tool against the elongate element to impart a second shape to a second portion of the elongate element; and
   providing a cutting feature on the shaping tool, and severing the elongate element with the cutting feature on the shaping tool.

5. The method of shaping a portion of an elongate element extending away from an area of a substrate, comprising:
   providing a substrate with a surface and an area adjacent the surface of the substrate;
   forming an elongate element connected to and extending from the substrate, the elongate element in a first shape;
   urging a shaping tool against the elongate element to impart a second shape to a second portion of the elongate element; and
   forming the elongate element using a wirebonder including a capillary, and severing the elongate element adjacent the capillary with a spark from an electrode.

6. The method of shaping a portion of an elongate element extending away from an area of a substrate, comprising:
   providing a substrate with a surface and an area adjacent the surface of the substrate;
   forming an elongate element connected to and extending from the substrate, the elongate element in a first shape;
   urging a shaping tool against the elongate element to impart a second shape to a second portion of the elongate element;
   mounting a plurality of flexible elements to the surface of the substrate;
   shaping the flexible elements with the shaping tool; and
   overcoating each one of the plurality of the flexible elements with at least one layer of at least one overcoating material.

7. The method according to claim 6, wherein
   the flexible elements comprise a first material;
   at least one layer of the overcoating material comprises a second material, wherein the first material is soft relative to the second material.

8. The method, according to claim 6, wherein:
   the overcoating material comprises a material selected from the group consisting of nickel and its alloys.

9. The method, according to claim 6, wherein the substrate is a sacrificial substrate, and further comprising removing the sacrificial substrate.

10. The method of shaping a portion of an elongate element extending away from an area of a substrate, comprising:
    providing a substrate with a surface and an area adjacent the surface of the substrate;

forming an elongate element connected to and extending from the substrate, the elongate element in a first shape;

urging a shaping tool against the elongate element to impart a second shape to a second portion of the elongate element; and overcoating the elongate element with an overcoating material of sufficient thickness and of sufficient yield strength to impart a desired amount of resiliency to the resulting composite interconnection element and to dominate said resiliency.

11. The method, according to claim 10, wherein:

the flexible element has a first yield strength;

the overcoating material has a second yield strength; and the second yield strength is at least twice the first yield strength.

12. The method of shaping a portion of an elongate element extending away from an area of a substrate, comprising:

providing a substrate with a surface and an area adjacent the adjacent the surface of the substrate;

forming an elongate element connected to and extending from the substrate, the elongate element in a first shape;

urging a shaping tool against the elongate element to impart a second shape to a second portion of the elongate element;

providing a terminal on the substrate, wherein the area of the substrate is the terminal; and overcoating the elongate element and at least an adjacent portion of the terminal with an overcoating material of sufficient thickness and of sufficient yield strength to securely mount the resulting composite interconnection element to the terminal, said overcoating material making a substantial contribution to anchoring the overcoated elongate element to the terminal.

13. The method of shaping a portion of an elongate element extending away from an area of a substrate, comprising:

providing a substrate with a surface and an area adjacent the surface of the substrate;

forming flexible, elongate element connected to and extending from the substrate, the flexible, elongate element in a first shape;

urging a shaping tool against the elongate element to impart a second shape to the flexible, elongate element; and overcoating the flexible, elongate element with at least one layer of at least one overcoating material.

* * * * *